United States Patent
Kwon et al.

(10) Patent No.: US 11,513,730 B2
(45) Date of Patent: *Nov. 29, 2022

(54) MEMORY DEVICE, MEMORY SYSTEM AND AUTONOMOUS DRIVING APPARATUS

(71) Applicant: Samsung Electronics Co., Ltd., Suwon-si (KR)

(72) Inventors: Taehong Kwon, Seoul (KR); Daeseok Byeon, Seongnam-si (KR); Chanho Kim, Seoul (KR); Taehyo Kim, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 233 days.

This patent is subject to a terminal disclaimer.

(21) Appl. No.: 16/892,574

(22) Filed: Jun. 4, 2020

(65) Prior Publication Data

US 2021/0124527 A1 Apr. 29, 2021

(30) Foreign Application Priority Data

Oct. 28, 2019 (KR) .................. 10-2019-0134680

(51) Int. Cl.
*G06F 11/00* (2006.01)
*G06F 3/06* (2006.01)
(Continued)

(52) U.S. Cl.
CPC ......... *G06F 3/0659* (2013.01); *G05D 1/0088* (2013.01); *G06F 3/0604* (2013.01);
(Continued)

(58) Field of Classification Search
None
See application file for complete search history.

(56) References Cited

U.S. PATENT DOCUMENTS 8,060,719 B2 11/2011 Radke et al.
8,078,794 B2 12/2011 Lee et al.
(Continued)

FOREIGN PATENT DOCUMENTS

KR 1020170081126 A 7/2017

OTHER PUBLICATIONS

H. Kim et al., "Three-Dimensional Integration Approach to High-Density Memory Devices," in IEEE Transactions on Electron Devices, vol. 58, No. 11, pp. 3820-3828, Nov. 2011, doi: 10.1109/TED.2011.2165286. (Year: 2011).
(Continued)

*Primary Examiner* — Mujtaba M Chaudry
(74) *Attorney, Agent, or Firm* — Muir Patent Law, PLLC

(57) ABSTRACT

A memory device includes a first memory area including a first memory cell array having a plurality of first memory cells each for storing N-bit data according to an M-bit data access scheme, where N is a natural number, and a first peripheral circuit for controlling the first memory cells and disposed below the first memory cell array, a second memory area including a second memory cell array having a plurality of second memory cells each for storing M-bit data according to an M-bit data access scheme, where M is a natural number greater than N, and a second peripheral circuit for controlling the second memory cells and disposed below the second memory cell array, the first memory area and the second memory area are included in a single semiconductor chip and share an input and output interface, and a controller configured to generate calculation data by applying a weight stored in the first memory area to sensing data in response to receiving the sensing data obtained by an external sensor, and store the calculation data in one of the first memory area or the second memory area according to the weight.

20 Claims, 18 Drawing Sheets

(51) Int. Cl.
  *G05D 1/00* (2006.01)
  *G06F 13/16* (2006.01)
  *G11C 5/02* (2006.01)
  *B60W 50/00* (2006.01)
(52) U.S. Cl.
  CPC ........ *G06F 3/0673* (2013.01); *G06F 13/1668* (2013.01); *G11C 5/025* (2013.01); *B60W 2050/0005* (2013.01); *G05D 2201/0213* (2013.01)

(56) References Cited

U.S. PATENT DOCUMENTS

| | | | |
|---|---|---|---|
| 8,676,734 | B2 | 3/2014 | Aparin |
| 8,892,598 | B2* | 11/2014 | Motwani ............... G06F 11/167 |
| | | | 707/770 |
| 9,632,729 | B2 | 4/2017 | Li et al. |
| 10,140,067 | B1 | 11/2018 | Horn et al. |
| 10,825,512 | B1* | 11/2020 | Baker, Jr. ............ G11C 11/2257 |
| 2010/0191922 | A1 | 7/2010 | Dickey et al. |
| 2011/0057959 | A1* | 3/2011 | Park .................... G09G 3/3648 |
| | | | 345/690 |
| 2014/0181428 | A1 | 6/2014 | Hsu et al. |
| 2016/0239384 | A1* | 8/2016 | Slik .................... G06F 11/1092 |
| 2017/0192902 | A1 | 7/2017 | Hwang et al. |
| 2018/0373437 | A1 | 12/2018 | Navon et al. |
| 2019/0164038 | A1 | 5/2019 | Zhang |
| 2021/0073063 | A1 | 3/2021 | Kale et al. |
| 2021/0151450 | A1 | 5/2021 | Or-Bach et al. |

OTHER PUBLICATIONS

H. Lue, K. Wang and C. Lu, "3D AND-type NVM for In-Memory Computing of Artificial Intelligence," 2018 14th IEEE International Conference on Solid-State and Integrated Circuit Technology (ICSICT), 2018, pp. 1-2, doi: 10.1109/ICSICT.2018.8564919. (Year: 2018).

* cited by examiner

MEMORY DEVICE, MEMORY SYSTEM AND AUTONOMOUS DRIVING APPARATUS

CROSS-REFERENCE TO RELATED APPLICATION(S)

This application claims benefit of priority to Korean Patent Application No. 10-2019-0134680 filed on Oct. 28, 2019 in the Korean Intellectual Property Office, the disclosure of which is incorporated herein by reference in its entirety.

BACKGROUND

Example embodiments of the present inventive concept relate to a memory device, a memory system and an autonomous driving apparatus.

A memory device may provide functions of writing or erasing data and reading written data. A memory device may include a plurality of memory cells, and generally, an amount of data writable to each memory cell may have a fixed value. In a neuromorphic computer system, an autonomous driving apparatus, or the like, suggested recently, a distributed storage method has been employed for storing data in consideration of importance of data. When memory cells are programmed by a single method without consideration of importance of data, reliability and/or operational efficiency of a memory device may degrade.

SUMMARY

An example embodiment of the present inventive concept is to provide a memory device in which a single memory chip included in a memory device includes a first memory area for storing N-bit data (N is a natural number) and a second memory area for storing M-bit data (M is a natural number greater than N) and data may be stored in the first memory area or the second memory area according to importance of data such that operation efficiency may improve, a computer system including the same, and an autonomous driving apparatus.

According to an example embodiment of the present inventive concept, a memory device includes a first memory area including a first memory cell array having a plurality of first memory cells each for storing N-bit data, where N is a natural number, and a first peripheral circuit for controlling the first memory cells according to an N-bit data access scheme and disposed below the first memory cell array, a second memory area including a second memory cell array having a plurality of second memory cells each for storing M-bit data, where M is a natural number greater than N, and a second peripheral circuit for controlling the second memory cells according to an M-bit data access scheme and disposed below the second memory cell array, and the first memory area and the second memory area are included in a single semiconductor chip and share an input and output interface, and a controller configured to generate calculation data by applying a weight stored in the first memory area to sensing data in response to receiving the sensing data obtained by an external sensor, and store the calculation data in one of the first memory area or the second memory area according to the weight.

According to an example embodiment of the present inventive concept, a memory system includes a first memory device provided as a first semiconductor chip, a second memory device sharing an input and output bus to which data is transmitted with the first memory device, and provided as a second semiconductor chip different from the first semiconductor chip, and an external interface connected to the input and output bus and configured to transmit and receive the data with an external device, each of the first memory device and the second memory device includes a first memory plane including a first memory cell array having first memory cells each for storing N-bit data, where N is a natural number, and a first page buffer circuit disposed below the first memory cell array and configured to perform a program operation and a read operation according to an N-bit data access scheme for at least one first select memory cell of the first memory cells, and a second memory plane including a second memory cell array having second memory cells each for storing M-bit data, where M is a natural number greater than N, and a second page buffer circuit disposed below the second memory cell array and configured to perform a program operation and a read operation according to an M-bit data access scheme for at least one second select memory cell of the second memory cells.

According to an example embodiment of the present inventive concept, a autonomous driving apparatus implementing an autonomous driving function of a vehicle includes a sensor configured to monitor a first sensing area and to output first sensing data in response to an event generated in a first space external to the vehicle and corresponding to the first sensing area, and configured to monitor a second sensing area and to output second sensing data in response to an event generated in a second space different from the first space and corresponding to the second sensing area, a processor configured to control movement of the vehicle according to the first sensing data and the second sensing data, and a memory device configured to generate first calculation data by applying a first weight to the first sensing data, generate second calculation data by applying a second weight lower than the first weight to the second sensing data, store the first calculation data in a first memory plane having memory cells each for storing N-bit data according to an N-bit data access scheme, where N is a natural number, and store the second calculation data in a second memory plane having memory cells each for storing M-bit data according to an M-bit data access scheme, where M is a natural number greater than N.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, embodiments of the present inventive concept will be described as follows, with reference to the accompanying drawings.

Figure 1:
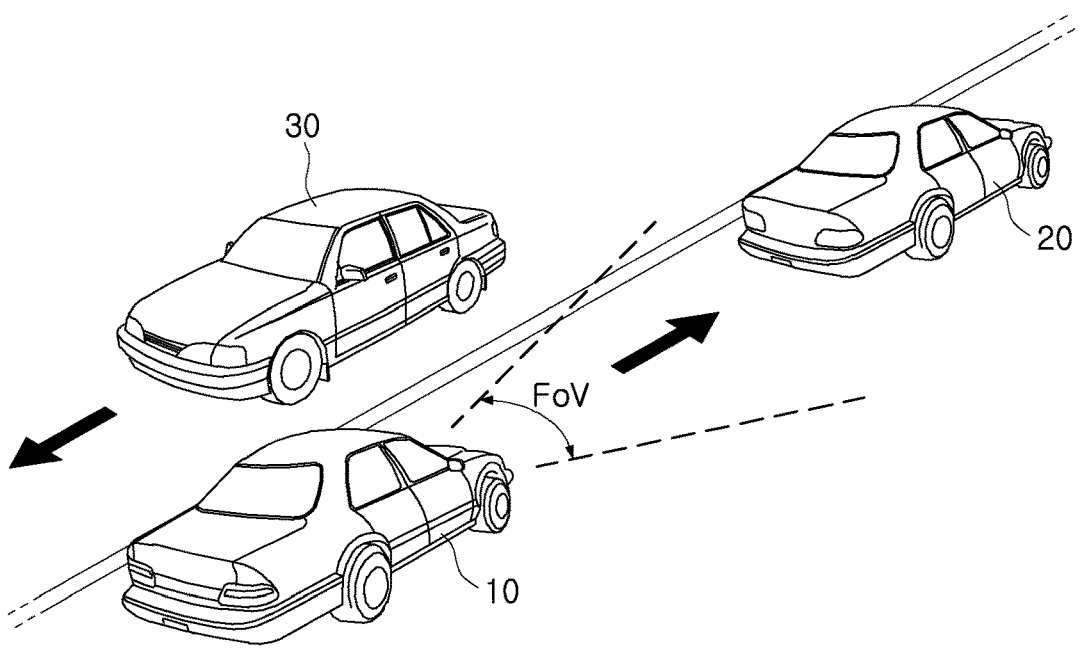
FIGS. 1 to 3 are diagrams illustrating an autonomous driving apparatus according to an example embodiment of the present inventive concept.
Figure 2:
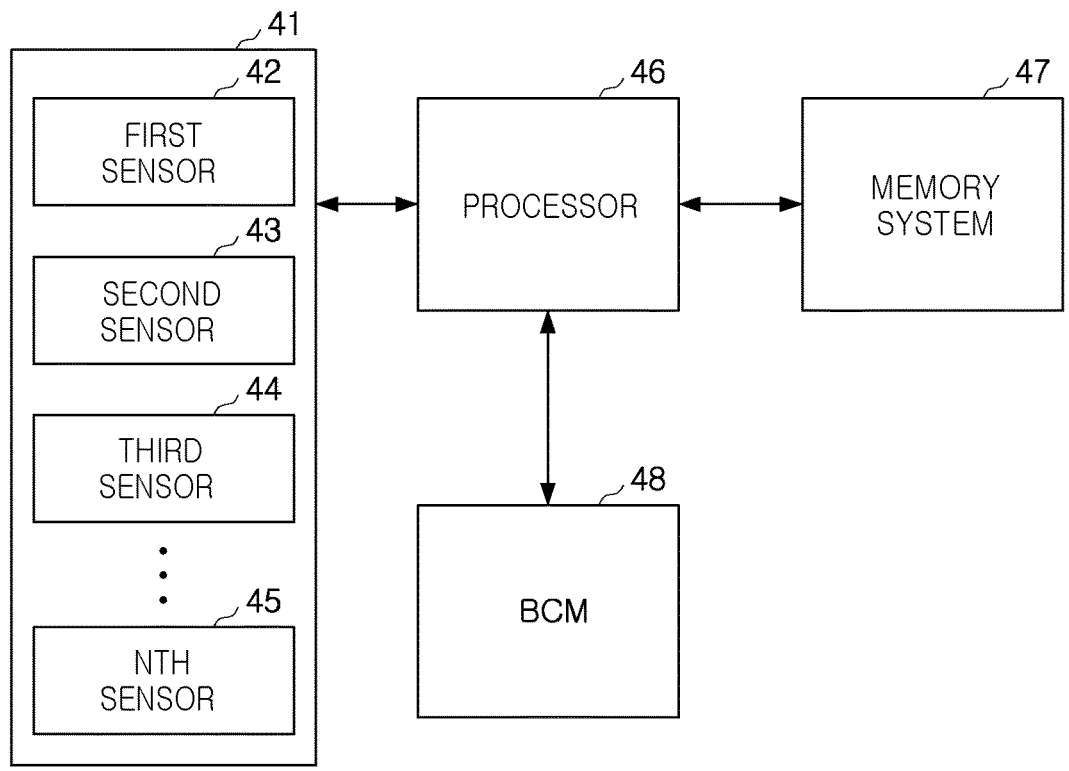
Figure 3:
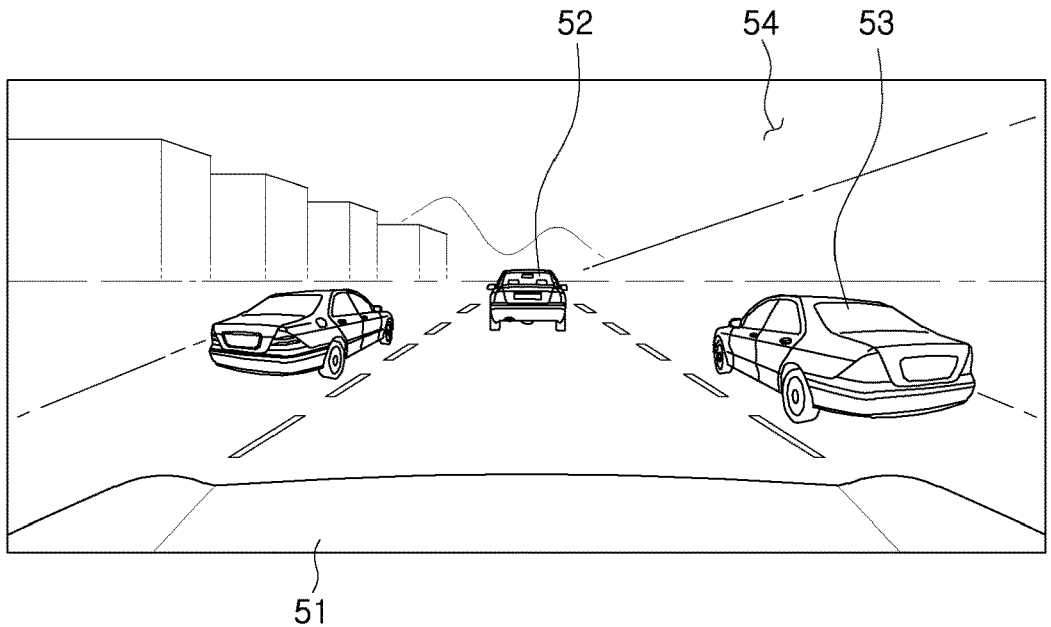

FIGS. 1 to 3 are diagrams illustrating an autonomous driving apparatus according to an example embodiment.

Referring to FIG. 1, an autonomous driving apparatus in this example embodiment may be mounted on a vehicle and may be used to implement an autonomous driving vehicle 10. The autonomous driving apparatus mounted on the autonomous driving vehicle 10 may include various sensors for collecting information on ambient conditions of the vehicle. As an example, the autonomous driving apparatus may sense movement of a preceding vehicle 20 travelling in front of the autonomous driving vehicle 10 through an image sensor and/or an event sensor mounted on the front side of the autonomous driving vehicle 10. The autonomous driving apparatus may further include sensors for sensing a further vehicle 30 travelling on an adjacent lane and pedestrians near the autonomous driving vehicle 10, in addition to the front area of the autonomous driving vehicle 10.

At least one of the sensors for collecting the information on ambient conditions of the autonomous driving vehicle may have a predetermined field of view FoV as illustrated in FIG. 1. As an example, when a sensor mounted on the front side of the autonomous driving vehicle 10 has a field of view FoV as illustrated in FIG. 1, the information detected from a center of the sensor may have a relatively high importance. That is because most of information corresponding to the movement of the preceding vehicle 20 may be included in the information detected from the center of the sensor.

The autonomous driving apparatus may process the information collected by the sensors of the autonomous driving vehicle 10 in real time and may control movement of the autonomous driving vehicle 10, and may store at least a portion of the information collected by the sensors in a memory device. Thus, data having a relatively high importance in relation to the driving of the autonomous driving vehicle 10 may be stored in an area of the memory device having high reliability (e.g., a relatively high reliability), and data having relatively low importance may be stored in an area having lower reliability (e.g., a relatively lower reliability).

In an example embodiment, the memory device may include a first memory area and a second memory area. Each of memory cells of the first memory area may store 1-bit data, and each of memory cells of the second memory area may store 2 or more bits of data. Data having high importance may be stored in the first memory area, and data having lower importance may be stored in the second memory area. Also, the first memory area and the second memory area may be implemented in a single memory device, such as a single memory chip, and if desired, the first memory area and the second memory area may be operated simultaneously such that operational performance of the memory device may improve and a storage space may be divided in an efficient manner. As used herein, a memory device may refer, for example, to a device such as a semiconductor chip (e.g., memory chip formed on a die from a wafer and including an integrated circuit including a memory cell array), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Semiconductor packages may include a package substrate, one or more semiconductor chips, and an encapsulant formed on the package substrate and covering the semiconductor chips.

Referring to FIG. 2, an autonomous driving apparatus 40 in the example embodiment of FIGS. 1-3 may include a sensor unit 41, a processor 46, a memory system 47, a vehicle body control module (BCM) 48, and other elements. The sensor unit 41 may include a plurality of sensors 42 to 45, and the plurality of sensors 42 to 45 may include an image sensor, an event sensor, an illumination sensor, a GPS device, an acceleration sensor, and the like.

The data collected by the sensors 42 to 45 may be transferred to the processor 46. The processor 46 may store data collected by the sensors 42 to 45 in the memory system 47 and may control the vehicle body control module 48 based on the data collected by the sensors 42 to 45 to determine movement of the vehicle. For example, if the sensors 42-45 detect a vehicle in front of the autonomous driving apparatus 40 suddenly stopping, the processor 46, based on receiving the sensed data, may control the mechanical systems of the autonomous driving apparatus 40 to apply the brakes to slow down the autonomous driving apparatus 40. The memory system 47 may include two or more memory devices, and a system controller for controlling the memory devices. Each of the memory devices may be provided as a single semiconductor chip.

Other than the system controller of the memory system 47, in some embodiments, each of the memory devices included in the memory system 47 may include a memory controller, and the memory controller may include an artificial intelligence (AI) calculation circuit such as a neural network. The memory controller may generate calculation data by applying a predetermined weight to the data received from the sensors 42 to 45 or the processor 46, and may store the calculation data in a memory chip. A single memory device (e.g., single memory chip) may have a first memory area and a second memory area, and the number of bits of data stored in each of the memory cells of the first memory area may be different from the number of bits of data stored in each of the memory cells of the second memory area. The memory controller may be part of the same single semiconductor chip that includes the first and second memory areas, or may be a different semiconductor chip to be part of a memory device (e.g., memory system 47) along with the memory chip, for example, in package form. The memory device (e.g., memory system 47) may therefore be configured so that a first set of memory cells in a first area of a single memory chip are accessed based on a single-level cell (SLC) access scheme, and a second set of memory cells in a second area of the single memory chip are accessed based on a multilevel cell (MLC) access scheme.

The memory controller may store the calculation data to which a relatively high weight is applied, for example data having a relatively high importance, in the first memory area, and may store calculation data to which a relatively low weight is applied in the second memory area. As a result, each of the memory cells of the first memory area may store N-bit data, and each of the memory cells of the second memory area may store M-bit data, where M and N area natural numbers, and M may be greater than N. In this manner, the memory controller may store the calculation data having a relatively high importance in the first memory area having relatively higher reliability, and may store the calculation data having relatively low importance in the second memory area having a relatively low reliability. Accordingly, operational performance and reliability of each of the memory devices included in the memory system 47 may improve, and a storage space may be managed in an efficient manner. In example embodiments, at least a portion of the above-described operations of the memory controller may be performed by a system controller of the memory system 47 (e.g., a controller outside of memory system 47, such as a separate controller chip).

As an example, each of the memory cells of the first memory area may be a single-level memory cell configured for storing 1-bit data, and each of the memory cells of the second memory area may be a multilevel memory cell configured for storing 2 or more bits of data. To accomplish this, a memory controller may be configured to access memory cells in the first memory area according to a single-level memory cell access scheme, and may be configured to access memory cells in the second memory area according to a multilevel memory cell access scheme. Hereinafter, when various memory areas are described as having different-bit data stored, a memory controller may be configured to access each area according to an appropriate memory cell access scheme for the number of bits stored by each cell in that area. In example embodiments, at least one memory device may include first to fourth memory areas. In this case, each of the memory cells of the second memory area may store 2-bit data, each of the memory cells of the third memory area may store 3-bit data, and each of the memory cells of the fourth memory area may store 4-bit data. As an example, the calculation data stored in the first memory area may have the highest importance, and the calculation stored in the fourth memory area may have the least importance.

FIG. 3 is a diagram illustrating an example of image data obtained by a sensor of an autonomous driving vehicle on which an autonomous driving apparatus is mounted. Referring to FIG. 3, image data may be obtained by a sensor mounted on the front side of the autonomous driving vehicle. Accordingly, the image data 50 may include a front area 51 of the autonomous driving vehicle, a preceding vehicle 52 travelling on the same lane on which the autonomous driving vehicle travels, a travelling vehicle 53 near the autonomous driving vehicle, a background 54, and other information.

In the image data 50 in the example embodiment illustrated in FIG. 3, data of an area on which the front area 51 of the autonomous driving vehicle and the background 54 are displayed may rarely affect the driving of the autonomous driving vehicle. Therefore, the front area 51 of the autonomous driving vehicle and the background 54 may be considered as having a relatively low importance.

A distance to the preceding vehicle 52, movement of the travelling vehicle 53 changing a lane, and the like, may be considered important factors in relation to safe driving of the autonomous driving vehicle. Accordingly, data of the area of the image data 50 including the preceding vehicle 52 and the travelling vehicle 53 may have a relatively high importance in relation to the driving of the autonomous driving vehicle.

The memory device of the autonomous driving apparatus may apply different weights to different areas of the image data 50 received from the sensor and may store the image data 50. As an example, a relatively high weight may be applied to data of the area including the preceding vehicle 52 and the travelling vehicle 53, and a relatively low weight may be applied to data of the area on which the front area 51 of the autonomous driving vehicle and the background 54 are displayed. The memory device may store the data applied with a relatively high weight and the data applied with a relatively low weight in different memory areas separately.

Figure 4:
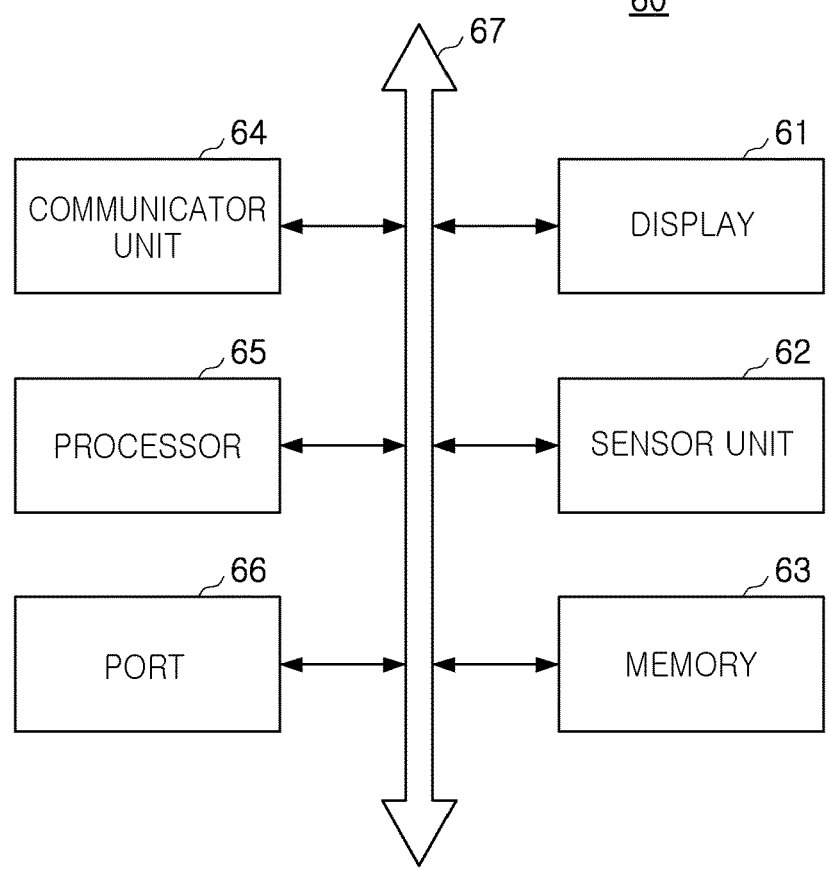
FIG. 4 is a block diagram illustrating a computer system according to an example embodiment of the present inventive concept.

FIG. 4 is a block diagram illustrating a computer system according to an example embodiment.

A computer system 60 in the example embodiment illustrated in FIG. 4 may include a display 61, a sensor unit 62, a memory 63, a communicator 64, a processor 65, a port 66, and other elements. The computer system 60 may further include a power device, an input and output device, and other devices, in addition to the above-mentioned elements. Among the elements illustrated in FIG. 4, the port 66 may be provided for the computer system 60 to communicate with a video card, a sound card, a memory card, a USB device, and the like. As an example, the computer system 60 may be implemented by a neuromorphic computer system including a circuit that mimics the form of neurons in a nervous system of a living organism, and the memory 63 and the processor 65 may include an artificial intelligence calculation module.

As is traditional in the field of the disclosed technology, features and embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

The processor 65 may include a neuromorphic circuit mimicking the form of neurons as hardware, and may control overall operations of the computer system 60. The memory 63 may be a storage medium for storing data. The memory 63 may include a plurality of memory devices, and each of the memory devices may include one or more semiconductor chips. A single memory device (e.g., a single memory chip in some embodiments) may include memory areas for storing data by different methods, and a memory controller included in the memory 63 may apply weights to different pieces of data and may store the different pieces of data in different memory areas separately, according to different respective memory access schemes.

As an example embodiment, a single memory device (e.g., single memory chip) may include a first memory area including a plurality of single-level memory cells for storing 1-bit data and a second memory area including a plurality of multilevel memory cells for storing 2 or more bits of data. The first memory area and the second memory area may be implemented in different memory planes. A weight applied to the data by the memory controller may also be stored in the memory 63, and the weight may be stored in the first memory area having a relatively high reading speed in consideration of a characteristic that the weight is frequently read out by the memory controller.

Figure 5:
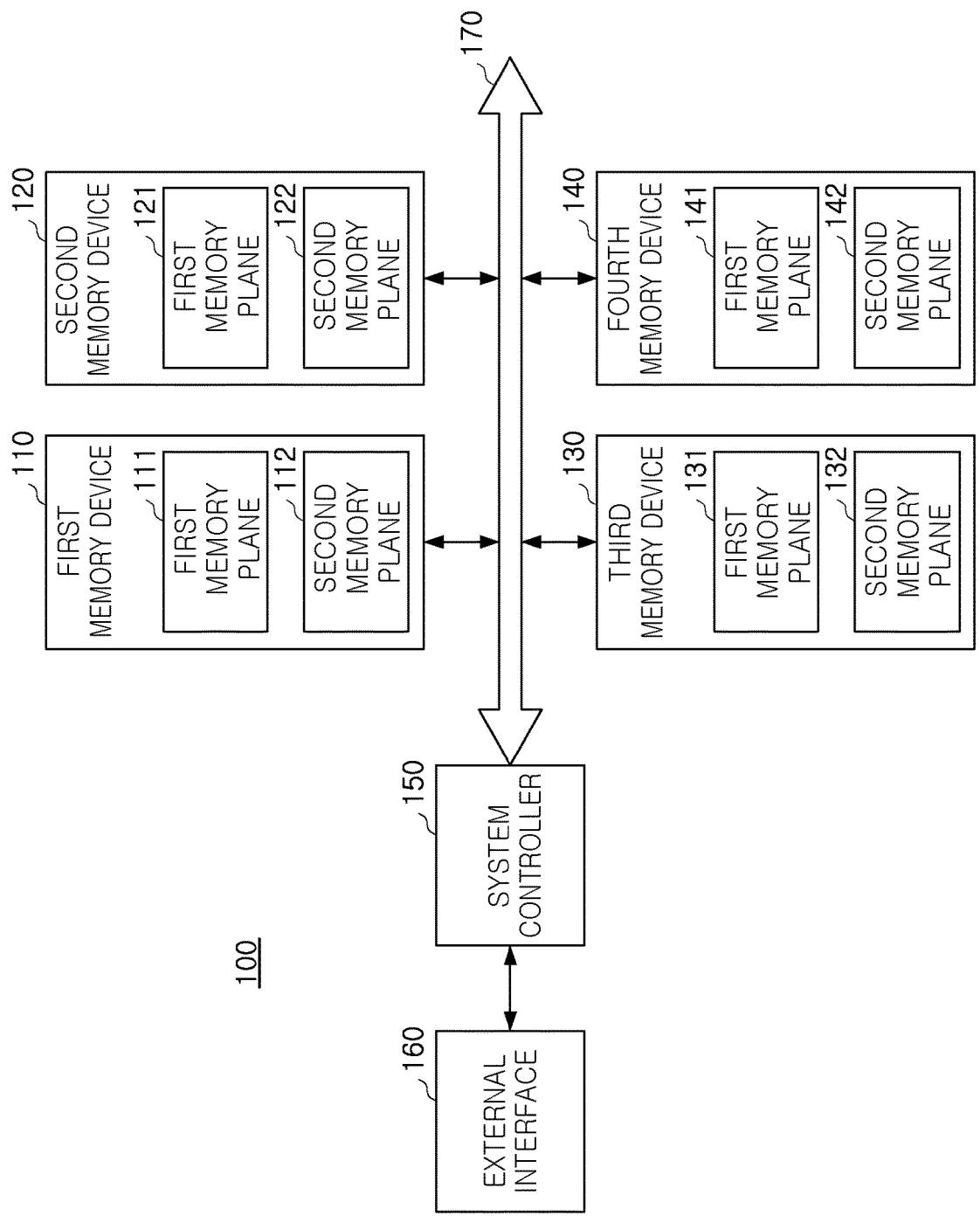
FIG. 5 is a block diagram illustrating a memory system according to an example embodiment of the present inventive concept.

FIG. 5 is a block diagram illustrating a memory system according to an example embodiment.

Referring to FIG. 5, a memory system 100 in the example embodiment may include a plurality of memory devices 110 to 140, a system controller 150, an external interface 160, and other elements.

The system controller 150 may control overall operations of the memory system 100, and may transmit data to and receive data from an external device through the external interface 160. The system controller 150 may also transmit data to be stored in the memory system 100 to at least one of the memory devices 110 to 140 through an input and output bus 170, and may receive data output by a read operation performed by at least one of the memory devices 110 to 140 through the input and output bus 170. In the example embodiment illustrated in FIG. 5, the external interface 160 may be separated from the system controller 150, but an example embodiment thereof is not limited thereto. The external interface 160 may be configured to be included in the system controller 150. The external interface 160 may be a single interface configured to receive and transmit data with an external device.

The memory devices 110 to 140, which may each be, for example, an individual memory chip, may include respective first memory planes 111, 121, 131, and 141 and second memory planes 112, 122, 132, and 142. As an example, each of the first memory planes 111, 121, 131, and 141 may include a first memory cell array having first memory cells for storing N-bit data (N is a natural number), and a first peripheral circuit disposed below the first memory cell array and controlling the first memory cells. Similarly, each of the second memory planes 112, 122, 132, and 142 may include a second memory cell array having second memory cells for storing M-bit data (M is a natural number greater than N), and a second peripheral circuit disposed below the second memory cell array and controlling the second memory cells. On each semiconductor chip, the first memory plane and second memory plane may be disposed at the same vertical level, for example, side-by-side. The first peripheral circuit and the second peripheral circuit may have similar structures, and may include an analog circuit having a voltage generator, a page buffer circuit, and a decoder circuit, for example.

Operations of the memory devices 110 to 140 will be described based on a first memory device 110 as an example. In an example embodiment, operations of the second to fourth memory devices 120 to 140 may be understood with reference to the descriptions of the operations of the first memory device 110.

In the first memory device 110, the first memory plane 111 and the second memory plane 112 may have the same structure, and may share a single input and output interface through a memory controller included in the first memory device 110. When the system controller 150 transmits data to be stored in the memory system 100 to the input and output bus 170, the memory controller of the first memory device 110 may receive the data and may apply a weight to the data, thereby generating calculation data.

The weight may be stored in the first memory plane 111, and the memory controller may determine a level of the weight in accordance with information included in the data. As an example, when sensing data is received from a sensor connected through the external interface 160, the memory controller may determine a level of the weight on the basis of an amount of change in event information included in the sensing data. Alternatively, a level of the weight may be determined in accordance with a position of a sensing area and/or a field of view sensed by the sensor generating the sensing data. The sensing data may be an individual piece of sensed data (e.g., speed), or may be data determined by the sensor based on one or more pieces of sensed data (e.g., change in speed).

In example embodiments, pieces of data applied with different weights may be transmitted through the input and output bus 170. The memory controller of the first memory device 110 may apply a first weight and a second weight to the pieces of data and may generate first calculation data and second calculation data. The memory controller may store the first calculation data in the first memory plane, and may store the second calculation data in the second memory plane. In one example embodiment, the first weight may be greater than the second weight. As an example, the memory controller may perform an operation of storing the first calculation data in the first memory plane and an operation of storing the second calculation data in the second memory plane simultaneously.

As another example, first calculation data applied with different weights may only be stored in the first memory device 110, and second calculation data may only be stored in the second memory device 120. In an example embodiment, calculation for generating calculation data by applying a weight, and distribution of the calculation data may be performed by the system controller 150.

As the memory devices 110 to 140 share a single input and output bus, in the above-described example embodiment, the first calculation data and the second calculation data may not be simultaneously stored. In the example embodiment, to simultaneously store the first calculation data and the second calculation data, the number of the input and output buses 170 may need to be increased, but an increased number of the input and output buses 170 may increase power consumption and manufacturing costs of the memory system 100.

Also, when the first calculation data and the second calculation data are simultaneously stored by increasing the number of the input and output buses 170, the number of the simultaneously operating input and output buses 170 and the number of simultaneously operating the memory devices 110 to 140 may increase. Accordingly, load driven by a host connected to the external interface 160 or the system controller 150 may increase, which may be disadvantageous in terms of high-speed driving.

In an example embodiment, each of the memory devices 110 to 140 may include the first memory planes 111, 121, 131, and 141 and the second memory planes 112, 122, 132, and 142, which may operate by different methods. Accordingly, the first calculation data and the second calculation data to which different weights are applied may be simultaneously stored in one of the memory devices 110 to 140, which may be advantageous in terms of power consumption, manufacturing costs, and high-speed operation.

In example embodiments, each of the memory devices 110 to 140 may further include a third memory plane and a fourth memory plane. In this case, each of the first memory cells of the first memory planes 111, 121, 131, and 141 may store 1-bit data, and each of the second memory cells of the second memory planes 112, 122, 132, and 142 may store two-bit data. Each of third memory cells of the third memory plane may store 3-bit data, and each of fourth memory cells of the fourth memory plane may store 4-bit data. The memory controller may store calculation data having a relatively higher weight in the first memory plane, and may store calculation data having a relatively lower weight in the fourth memory plane.

Figure 6:
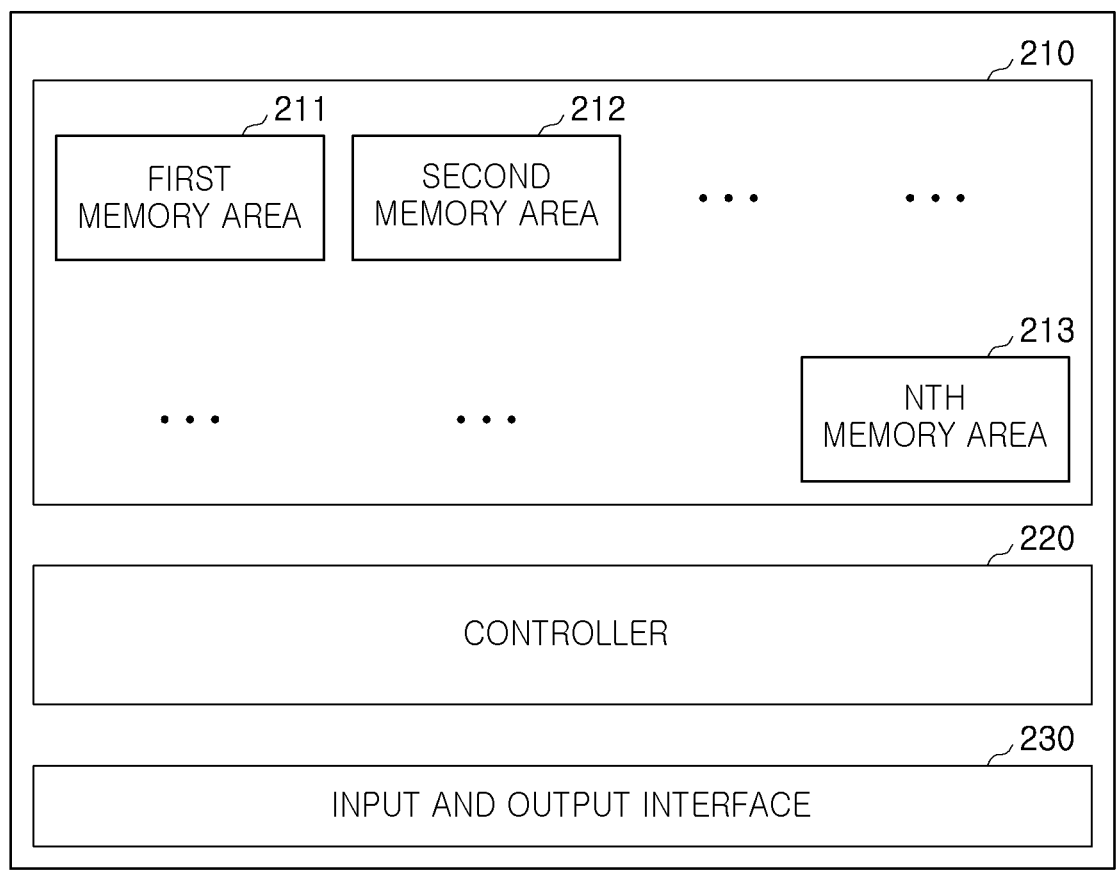
FIG. 6 is a block diagram illustrating a memory device according to an example embodiment of the present inventive concept.

FIG. 6 is a block diagram illustrating a memory device according to an example embodiment. For example, the memory device shown in FIG. 6 may represent an example embodiment of one of the memory devices 110, 120, 130, or 140 shown in FIG. 5.

Referring to FIG. 6, a memory device 200 in this example embodiment may include a storage area 210, a controller 220, and an input and output interface 230. The storage area 210 may include a plurality of memory areas 211 to 213.

Each of the memory areas 211 to 213 may include a memory cell array in which memory cells are disposed, and a peripheral circuit in which circuits for controlling the memory cell array is disposed. For example, the first memory area 211 may include a first memory cell array and a first peripheral circuit. In each of the memory areas 211 to 213, the peripheral circuit may be disposed below the memory cell array. For example, the memory areas 211 to 213 may have a cell-on-peri (COP) structure in which the memory cell array is disposed on the peripheral circuit.

Each memory cell array may include memory cells, and the memory cells may provide memory cell strings. The memory cells in each of the memory cell strings may be connected to each other in series, and a switch device may be connected to each of both ends of each memory cell. The memory cells included in each of the memory cell strings may be connected to each other in a direction perpendicular to an upper surface of a substrate. Accordingly, the memory device 200 may be configured as a vertical-type memory device.

The peripheral circuit may include circuits for controlling the memory cell array, such as a page buffer circuit and a decoder circuit, for example. In example embodiments, the peripheral circuit may include a power circuit generating a voltage required for driving the page buffer circuit and the decoder circuit. The decoder circuit may be connected to the memory cells through word lines, and the page buffer circuit may be connected to the memory cells through bit lines.

The controller 220 may include an artificial intelligence calculation module, and may transmit data to and receive data from an external device, such as an external processor or sensor, or the like, through the input and output interface 230. For example, the controller 220 may generate calculation data by applying a predetermined weight to sensing data received from an external sensor, and may store calculation data in the storage area 210. A weight applied to sensing data by the controller may also be stored in the storage area 210. For example, weight information or a weight index may be applied to data sensed from a sensor to determine calculated data to be stored in a storage area. The calculated data may be stored along with the weight information in the storage area.

As least a portion of the memory areas 211 to 213 may store data by different methods. For example, each of the memory cells of the first memory area 211 may store N-bit data. Each of the memory cells of the second memory area 212 may store M-bit data, and M may be a natural number greater than N.

In an example, the controller 220 may store the calculation data (e.g., data calculated or determined based on sensed data from a sensor, among other factors) applied with a relatively high weight in the first memory area 211, and may store the calculation data applied with a relatively low weight in the second memory area 212. The controller 220 may store the calculation data in the first memory area 211 or the second memory area 212 on the basis of a comparison relationship between the weight applied when the calculation data is used and a reference value.

As an example, each of the memory cells of the first memory area 211 may store 1-bit data, and each of the memory cells of the second memory area 212 may store 2 or more bits of data. The first memory area 211 may have reliability higher than that of the second memory area 212. The controller 220 may generate calculation data by applying a relatively higher weight to relatively more important sensing data, and may store the calculation data in the first memory area 211, thereby improving reliability of the memory device 200.

Also, in an example embodiment, in the storage area 210 of the memory device implemented as a single semiconductor chip, the first memory area 211, a memory plane having single-level memory cells, and the second memory area 212, a memory plane having multilevel memory cells may be implemented. As the first memory area 211 and the second memory area 212 are included in a single semiconductor chip, the first memory area 211 and the second memory area 212 may share the input and output interface 230.

Differently from the aforementioned example embodiments, two memory devices implemented as different semiconductor chips may be driven by single-level memory cells and multilevel memory cells, respectively. In this case, two or more buses connected to a host may be required to simultaneously drive the two memory devices, which may cause loss in terms of a design and production costs. Also, even when two or more busses are prepared to simultaneously drive the two memory devices, it may be necessary to input signals to and output signals from the input and output interfaces of the two memory devices simultaneously, which may consume relatively high power.

In contrast, in certain example embodiments, the first memory area 211 and the second memory area 212 included in a single semiconductor chip and sharing the input and output interface may be driven by single-level memory cells and multilevel memory cells, respectively. Accordingly, the calculation data applied with a relatively high weight and the calculation data applied with a relatively low weight may be transmitted to and received from a host using only a signal input and output through the single input and output interface. Consequently, the calculation data applied with various weights may be processed in parallel without increasing the number of the buses, and the single-level memory cells and the multilevel memory cells may be simultaneously driven through the single input and output interface such that an increase of power consumption may be reduced, and high-speed driving may be implemented.

In an example embodiment, the first memory area 211 and the second memory area 212 may simultaneously operate. For example, while a program operation or a read operation is performed in the first memory area 211, a program operation or a read operation may also be performed in the second memory area 212. Types of the operations performed in the first memory area 211 and the second memory area 212 may be the same or different. In addition, addresses at which the operations are performed in the first memory area 211 and the second memory area 212 may also be the same or different.

The memory cell arrays included in the memory areas 211 to 213 may have the same structure. For example, physical structures of the memory cell arrays included in the memory areas 211 to 213 may be the same, and accordingly, the number of the single-level memory cells included in the first memory area 211 may be the same as the number of the multilevel memory cells included in the second memory area 212.

A peripheral circuit included in the memory areas 211 to 213 may have different structures. As an example, a first page buffer circuit included in the peripheral circuit of the first memory area 211 may have a structure different from a structure of a second page buffer circuit included in the peripheral circuit of the second memory area 212. The first page buffer circuit may include a lower number of latches than a number of latches included in the second page buffer circuit, and accordingly, an area in which the first page buffer circuit is disposed may be smaller than an area in which the second page buffer circuit is disposed. Other than the page buffer circuit, circuits for generating a voltage required for driving the memory cells may be configured differently in the first memory area 211 and the second memory area 212.

Figure 7:
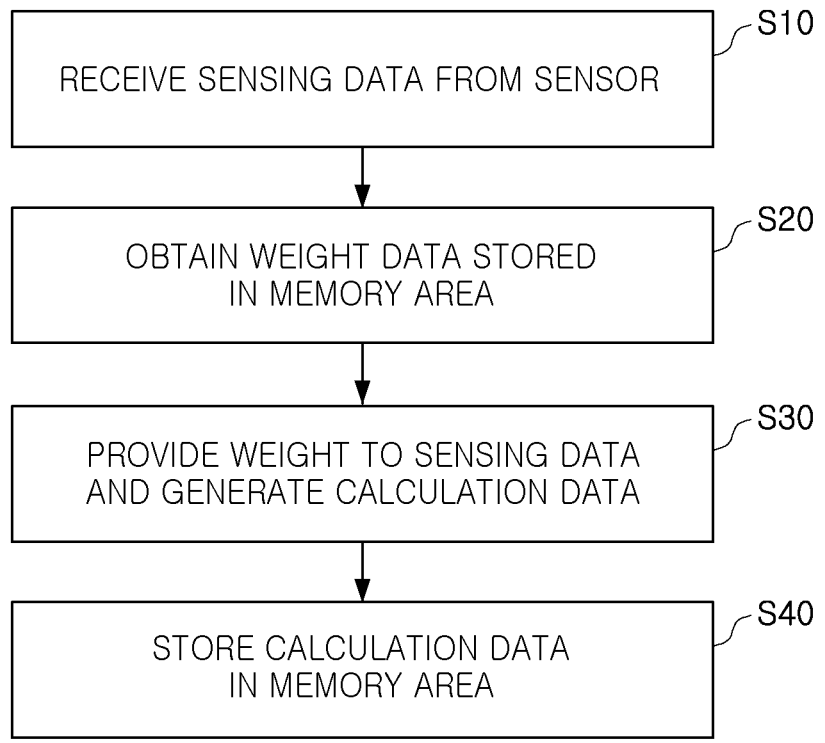
FIG. 7 is a flowchart illustrating operations of a memory device according to an example embodiment of the present inventive concept.

FIG. 7 is a flowchart illustrating operations of a memory device according to an example embodiment.

Referring to FIG. 7, an operation of a memory device in the example embodiment may start with receiving sensing data from a sensor by a memory device (S10). The memory device may receive sensing data through a separate processor or may directly receive the sensing data from a sensor. In an example embodiment, the sensor may be attached to an autonomous driving vehicle and may collect ambient information, and the memory device may be mounted on the autonomous driving vehicle.

When the sensing data is received, a memory controller of the memory device may obtain weight data stored in the memory area (S20). Different weight data may be associated with different types of sensing data, and may be stored in association with these types of sensing data. As an example, whenever the memory device receives the sensing data, the memory controller may read out the weight data, and thus, the weight data may be stored in a memory area securing relatively high reliability. For example, the memory area in which the weight data is stored may be a memory plane in which each of memory cells stores 1-bit or 2-bit data.

The memory controller reading out the weight data may apply a weight to the sensing data and may generate calculation data (S30). The memory controller may store the calculation data in the memory area (S40). In operation S40, the memory controller may determine a memory area for storing the calculation data in accordance with a weight used as a basis of the calculation data, rather than determining a memory area for storing based on sensing data itself. The calculation data may be, for example, the sensing data with a weight attached to it. For example, the calculation data may reflect the original sensing data as marked by a weight.

The memory controller may compare the weight used as a basis of the calculation data with reference values, and may determine a memory area for storing the calculation data according to a result of the comparison. As an example, when the weight is equal to or higher than a first reference value, a memory area for storing the calculation data may be a first memory plane in which each of memory cells stores 1-bit data. When the weight is smaller than the first reference value and equal to or higher than a second reference value, a memory area for storing the calculation data may be a second memory plane in which each of memory cells stores 2-bit data. When the weight is smaller than the second reference value and equal to or higher than a third reference value, the calculation data may be stored in a third memory plane in which each of memory cells store 3-bit data. When the weight is smaller than the third reference value and equal to or higher than a fourth reference value, the calculation data may be stored in a fourth memory plane in which each of memory cells stores 4-bit data.

The first to fourth memory planes may be included in a memory device provided as a single semiconductor chip and may share a single input and output interface. Also, the memory controller may control the memory areas such that at least two or more of the first to fourth memory planes may perform at least one of a program operation or a read operation simultaneously.

Figure 8:
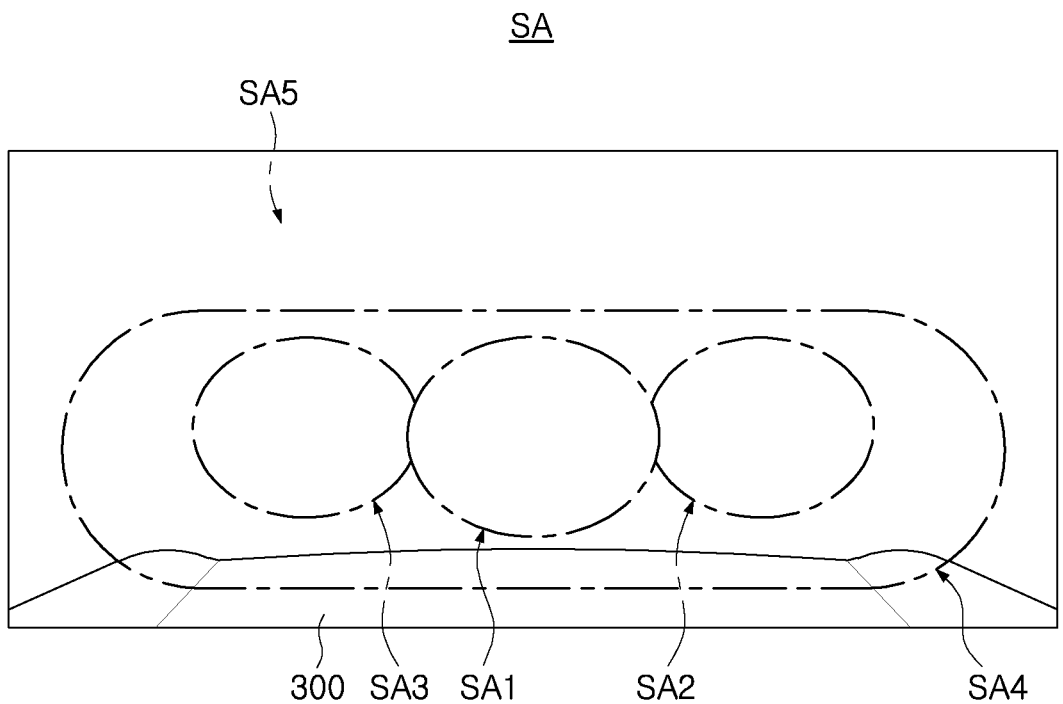
FIG. 8 is a diagram illustrating a sensor interlocked with a memory device according to an example embodiment of the present inventive concept.

FIG. 8 is a diagram illustrating a sensor interlocked with a memory device according to an example embodiment.

Referring to FIG. 8, a sensor in the example embodiment may be configured as one of elements of an autonomous driving apparatus, and may be mounted on an autonomous driving vehicle 300 and may collect information on ambient conditions of the autonomous driving vehicle 300. The sensor may collect information in a sensor area SA, and the sensor area SA may include first to fifth sensing areas SA1 to SA5. In this manner, the sensor may monitor the different sensing areas SA1 to SA5. However, an example embodiment thereof is not limited thereto, and the sensor area SA may divided into a greater or lower number of sensing areas. Also, positions of the sensing areas may be varied, differently from the example embodiment illustrated in FIG. 8.

A sensor may include an image sensor and/or an event sensor, and information collected by the sensor may be configured as sensing data and may be transmitted to a memory device mounted on the autonomous driving vehicle 300. The memory device may apply a weight to the sensing data in accordance with positions of the sensing areas SA1 to SA5 in which information corresponding to the sensing data is collected, types of the information included in the sensing data, and the like, and may store the sensing data in one of the memory areas. In the description below, the example embodiment will be described in greater detail with reference to FIGS. 8 to 10.

Figure 9:
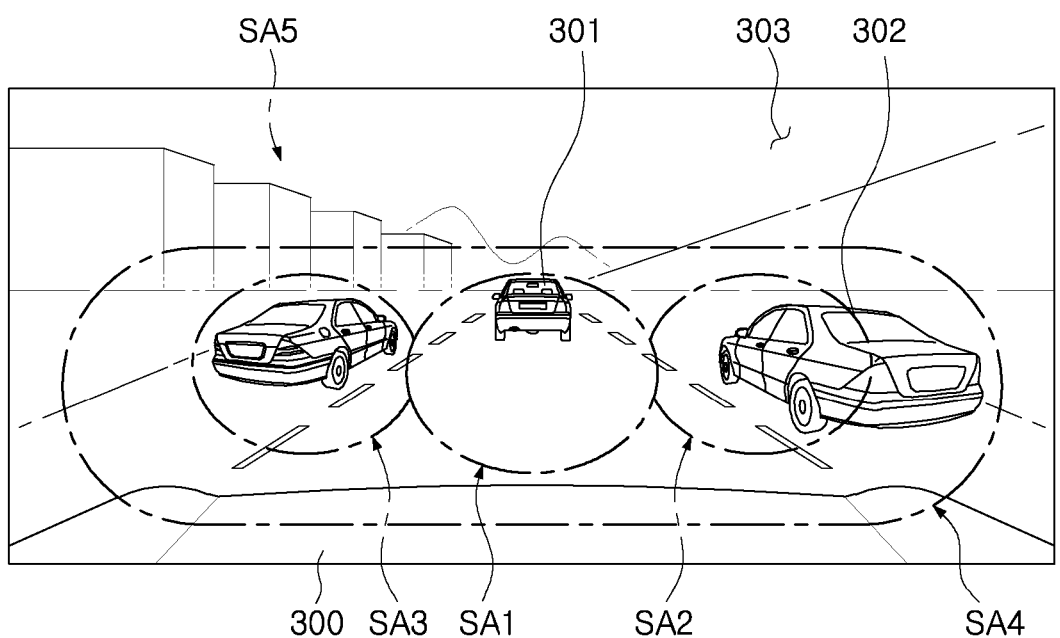
FIGS. 9, 10A, and 10B are diagrams illustrating operations of a memory device in an autonomous driving apparatus according to an example embodiment of the present inventive concept.
Figure 10A:
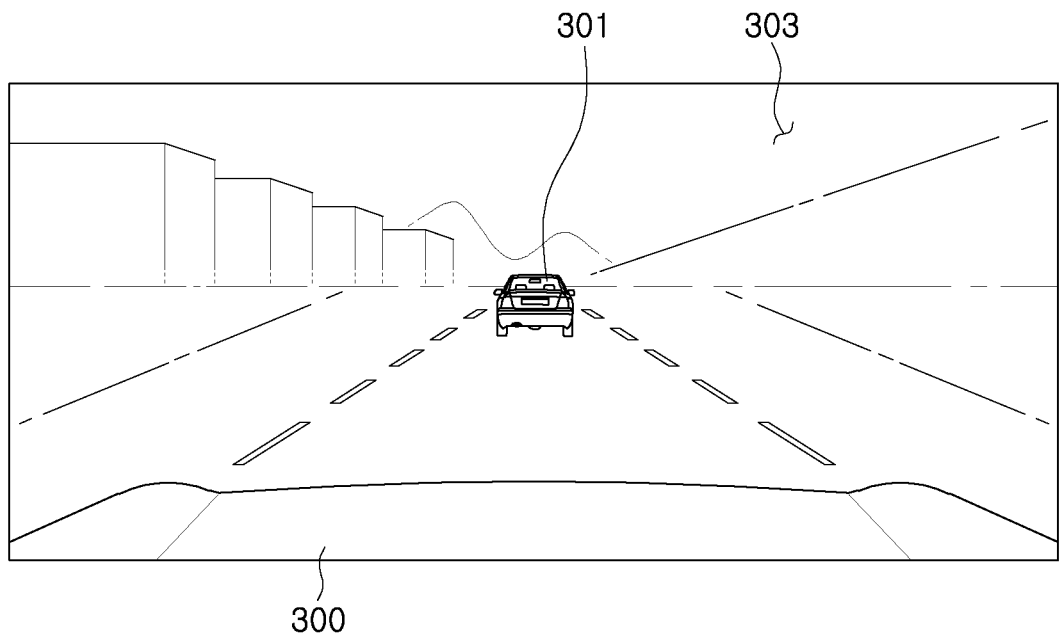
Figure 10B:
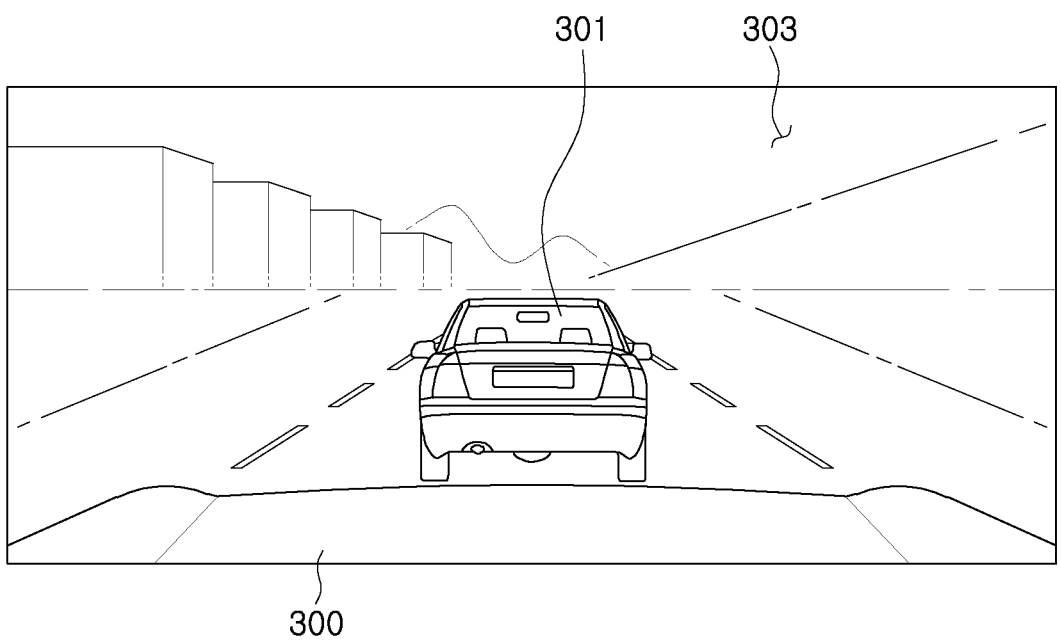

FIGS. 9, 10A, and 10B are diagrams illustrating operations of a memory device in an autonomous driving apparatus according to an example embodiment.

Referring to FIG. 9, different types of information may be collected in sensing areas SA1 to SA5 in accordance with positions of the sensing areas SA1 to SA5 of a sensor. For example, first sensing data obtained from the first sensing area SA1 by the sensor may include information on a preceding vehicle 301 travelling in front of an autonomous driving vehicle 300 on which an autonomous driving apparatus is mounted. The first sensing data may include information on a distance to the preceding vehicle 301. Alternatively, the first sensing data may include information required for determining a distance to the preceding vehicle 301, such as information on a type and a size of the preceding vehicle 301, for example.

Second sensing data, third sensing data, and fourth sensing data obtained from the second sensing area SA2, the third sensing area SA3, and the fourth sensing area SA4 by the sensor may include information on an additional vehicle 302 travelling near an autonomous driving vehicle. Also, the fifth sensing area SA5 may mainly include information on a background.

Accordingly, the first sensing data may be classified as data having a relatively high importance, and the fifth sensing data may be classified as data having a relatively low importance. When a memory device mounted on the autonomous driving vehicle 300 receives sensing data from the sensor, a memory controller may determine which one of the first to fifth sensing areas is a sensing area from which sensing data is obtained, and the memory controller may apply a weight to the sensing data according to a result of the determination.

For example, a first weight may be applied to the first sensing data obtained by the sensor sensing the preceding vehicle 301, and a second weight may be applied to the second sensing data obtained by the sensor sensing the additional vehicle 302. The first weight may be greater than the second weight. The memory controller may store first calculation data generated by applying the first weight to the first sensing data in the first memory area, and may store second calculation data generated by applying a second weight to the second sensing data in the second memory area. Each of memory cells of the first memory area may store N-bit data, and each of memory cells of the second memory area may store M-bit data. In the above-described example, M and N are natural numbers and M is greater than N.

The fifth sensing data obtained from the fifth sensing area SA5 which mainly includes the background 303 by the sensor may be stored in the memory area in which each of the memory cells stores the highest number of bits of data. As an example, when one of the memory cells of memory planes of the memory device stores 4-bit data, a fifth weight may be applied to the fifth sensing data and the fifth sensing data may be stored in a corresponding memory plane. As an example, the fifth weight may have the least value among weights which the memory controller applies to the sensing data.

In an example embodiment illustrated in FIGS. 10A and 10B, a sensor may be configured as an event sensor. As an example, the sensor may operate asynchronously and may sense an event generated around an autonomous driving vehicle 300. When sensing data is received from the sensor sensing the event, a memory controller may determine strength, a type, and the like, of the event on the basis of an amount of change between the sensing data and previous sensing data stored in a memory device.

For example, as illustrated in FIGS. 10A and 10B, when a speed of the autonomous driving vehicle 300 decreases, the sensing data obtained by the sensor sensing the autonomous driving vehicle 300 may greatly change, differently from the previous sensing data. For example, there may be a relatively great difference between the previous sensing data obtained by the sensor sensing the preceding vehicle 301 in the example embodiment illustrated in FIG. 10A and the sensing data obtained by the sensor sensing the preceding vehicle 301 in the example embodiment illustrated in FIG. 10B.

In one embodiment, the greater the amount of change between the sensing data and the previous sensing data, the higher the weight the memory controller of the memory device interlocked with the sensor may apply to the sensing data. Also, the memory controller may store sensing data in a first memory area including first memory cells each storing N-bit data. As the first memory cells have stability and a reading speed higher than those of second memory cells storing M-bit data greater N-bit data, data corresponding to an important event, such as a distance to the preceding vehicle 301, may be stored in the first memory area.

Figure 11:
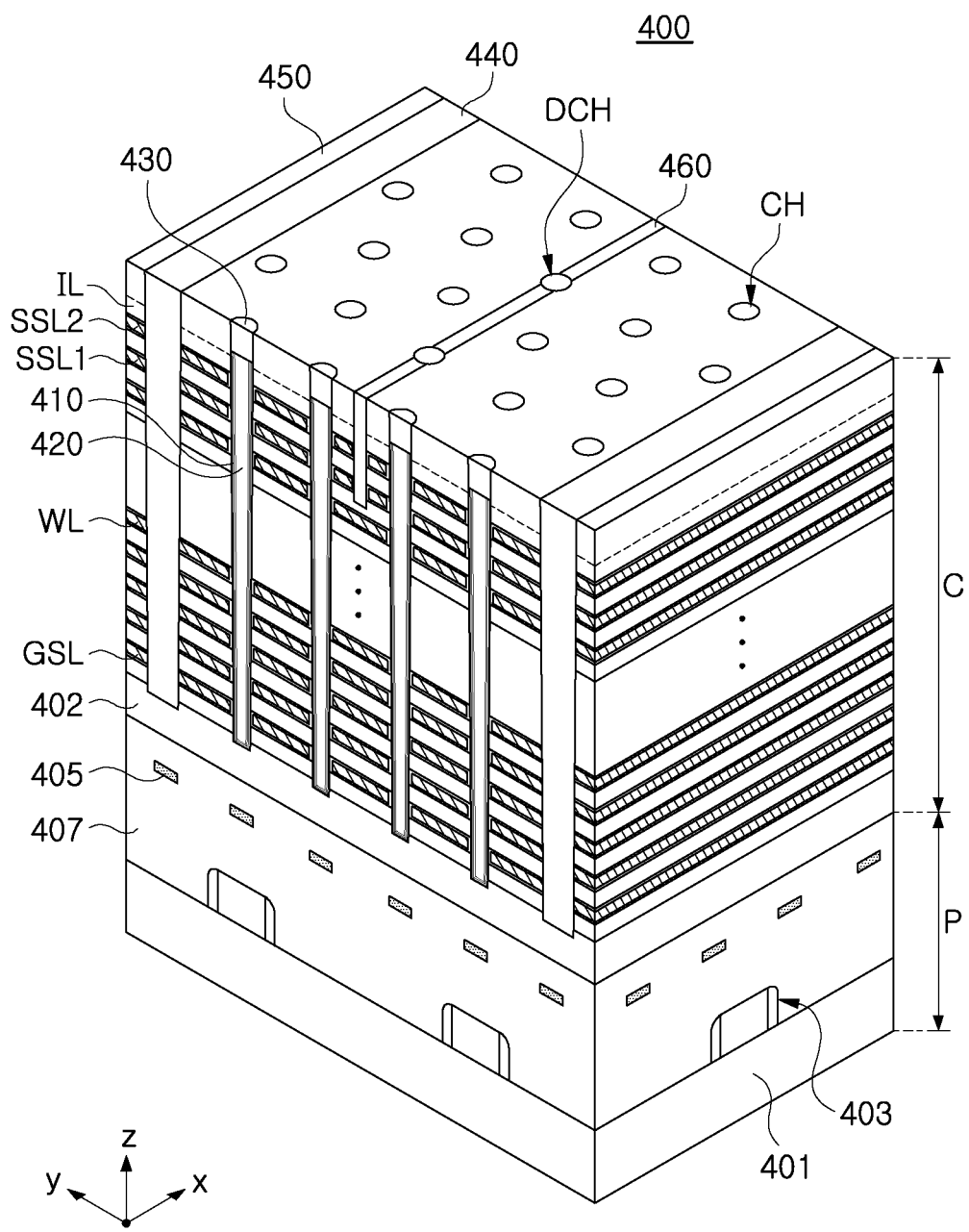
FIGS. 11 and 12 are diagrams illustrating a structure of a memory device according to an example embodiment of the present inventive concept.
Figure 12:
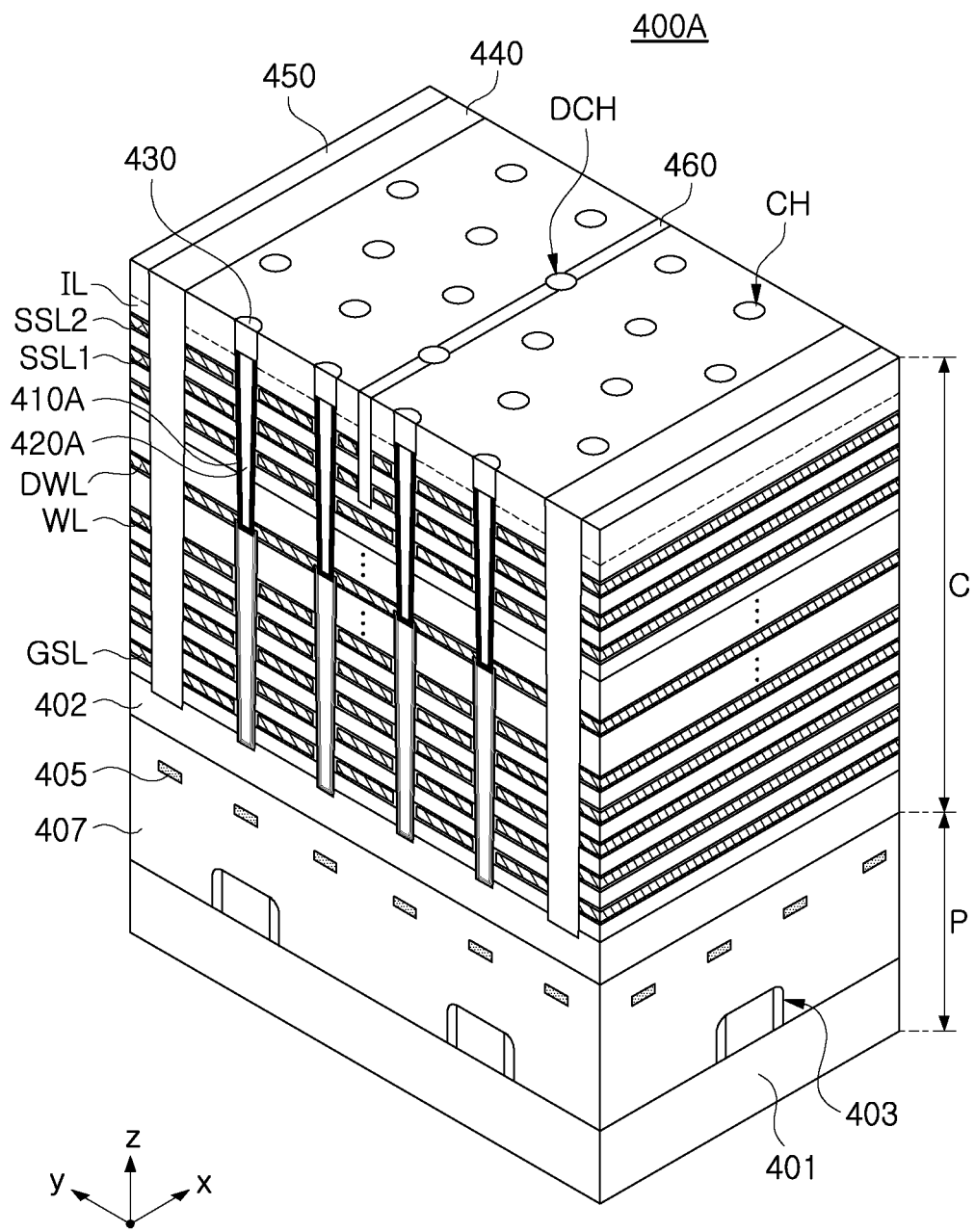

FIGS. 11 and 12 are diagrams illustrating a structure of a memory device according to an example embodiment. In example embodiments, these structures may be used to implement the memory chips discussed above, in connection with FIGS. 5 and 6.

FIGS. 11 and 12 are perspective diagrams illustrating memory devices 400 and 400A according to an example embodiment. Referring to FIG. 11, a memory device 400 in the example embodiment may include a cell region C and a peripheral circuit area P disposed upwardly and downwardly. The peripheral circuit area P may be disposed below the cell region C, and may include peripheral circuits such as a page buffer circuit, a decoder circuit, and the like. The cell region C may include a memory cell array. The peripheral circuit area P may include a first substrate 401, and the cell region C may include a second substrate 402 different from the first substrate 401.

For example, the peripheral circuit area P may include a plurality of peripheral circuit devices 403 disposed on the first substrate 401, a plurality of wiring lines 405 connected to the peripheral circuit devices 403, and a first interlayer insulating layer 407 covering the peripheral circuit devices 403 and the wiring lines 405. The peripheral circuit devices 403 included in the peripheral circuit area P may provide a circuit for driving the memory device 400, such as a page buffer circuit, a decoder circuit, a power generator, and the like, for example.

The second substrate 402 included in the cell region C may be disposed on the first interlayer insulating layer 407. The cell region C may include a ground select line GSL, word lines WL, and string select lines SSL1 and SSL2, stacked on the second substrate 402, and a plurality of insulating layers IL. The insulating layers IL may be alternately layered with the ground select line GSL, the word lines WL, and the string select lines SSL1 and SSL2. The number of the ground select line GSL and the number of string select lines SSL1 and SSL2 may not be limited to the examples illustrated in FIG. 11, and may be varied.

The cell region C may include channel structures CH extending in a first direction (Z axis direction) perpendicular to an upper surface of the second substrate 402, and the channel structures CH may penetrate the ground select line GSL, the word lines WL, and the string select lines SSL1 and SSL2 and may be connected to the second substrate 402. The channel structures CH may include a channel region 410, a buried insulating layer 420 filling an internal space of the channel region 410, and a bit line connecting layer 430. Each of the channel structures CH may be connected to at least one bit line through the bit line connecting layer 430. As an example, the ground select line GSL, the word lines WL, the string select lines SSL1 and SSL2, the insulating layers IL, and the channel structures CH may be defined as a stack structure.

At least one gate insulating layer may be disposed in an outer region of the channel region 410. In an example embodiment, the gate insulating layer may include a tunneling layer, an electric charge storage layer, and a blocking layer. In example embodiments, at least one of the tunneling layer, the electric charge storage layer, and the blocking layer may be configured to surround the ground select line GSL, the word lines WL, and the string select lines SSL1 and SSL2.

The ground select line GSL, the word lines WL, and the string select lines SSL1 and SSL2 may be covered by an interlayer insulating layer 450. Also, the ground select line GSL, the word lines WL, and the string select lines SSL1 and SSL2 may be divided into a plurality of regions by word line cuts 440. In an example embodiment, the string select lines SSL1 and SSL2 may be divided into a plurality of areas by a separation insulating layer 460 between a pair of adjacent word line cuts 440 in a second direction (Y axis direction) parallel to an upper surface of the second substrate 402.

In an example embodiment, in a region in which the separation insulating layer 460 is disposed, dummy channel structures DCH may be disposed. The dummy channel structures DCH may have a structure the same as the channel structures CH, and may not be connected to a bit line.

Referring to FIG. 12, the memory device 400A in the example embodiment may include a cell region C and a peripheral circuit area P disposed upwardly and downwardly. The memory device 400 in the example embodiment illustrated in FIG. 12 may have a structure similar to the structure of the memory device 400A in the example embodiment illustrated in FIG. 10. Thus, the descriptions of similar elements described with reference to FIG. 10 may not be provided.

In the example embodiment illustrated in FIG. 12, to overcome difficulty in process caused by an increased number of the word lines WL, a portion of the word lines WL may be stacked and a lower channel structure may be formed, and then the other portion of the word lines WL may be stacked and an upper channel structure may be formed. Accordingly, as illustrated in FIG. 12, structures of a channel region 410A and a buried insulating layer 420A may be different from the examples illustrated in FIG. 11. As an example, the lower channel structure and the word lines penetrated by the lower channel structure may be defined as a lower stack structure, and the upper channel structure and the word lines penetrated by the upper channel structure may be defined as an upper stack structure.

The lower channel structure may extend from the second substrate 402, and the upper channel structure may extend from the lower channel structure and may be connected to a bit line through the bit line connecting layer 430. In each of the channel structures DCH, the channel region 410A of the upper channel structure may be connected to the channel region 410A of the lower channel structure.

Properties of a memory cell may be deteriorated in a region adjacent to a boundary at which the upper channel structure is connected to the lower channel structure. Accordingly, a dummy word line DWL may be disposed on the region adjacent to the boundary. The dummy word line DWL may be connected to a dummy memory cell, and valid data may not be stored in the dummy memory cell.

FIGS. 13A-13D are diagrams illustrating operations of a memory device according to an example embodiment.

FIGS. 13A-13D illustrate operations of first to fourth memory planes included in a memory device according to an example embodiment. The graphs depicted in FIGS. 13A-13D illustrate distribution of threshold voltages of memory cells according to stored data. The first to fourth memory planes may be included in a single memory device provided to a single semiconductor chip and may share a single input and output interface. The first to fourth memory planes may be disposed at the same vertical levels as each other within the memory chip, and may be horizontally separated with respect to each other. Also, two or more of the first to fourth memory planes may operate simultaneously.

Figure 13A:
FIGS. 13A-13D are diagrams illustrating operations of a memory device according to example embodiments of the present inventive concept.

Each of the memory cells of the first memory plane may store 1-bit data. Each of the memory cells may have one of an erase state E0 and a program state P0 as illustrated in FIG. 13A according to stored data. The erase state E0 may indicate distribution of a threshold voltage of memory cells which have not been programed, and the program state P0 may indicate a distribution of a threshold voltage of memory cells which have been programed. To implement the single-bit storage for the memory cells of the first memory plane, a memory controller may be configured to access memory cells of the first memory plane according to a single-bit storage scheme according to the erase state E0 and program state P0.

Figure 13B:
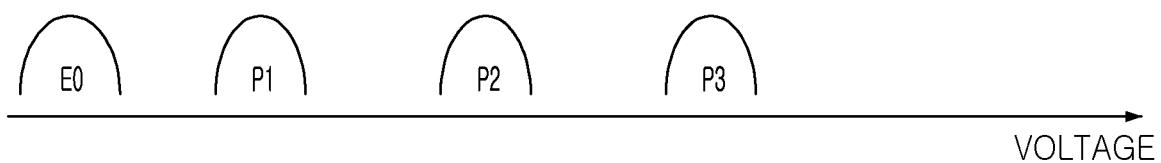

Each of memory cells of the second memory plane may store 2-bit data. Each of memory cells may have an erase state E0 and one of first to third program states P1 to P3 as illustrated in FIG. 13B according to stored data. The erase state E0 may illustrate distribution of threshold voltages of memory cells which have not be programed, and the first to third program states P1 to P3 may illustrate distribution of threshold voltages of memory cells which have been programed based on different data. To implement the 2-bit storage for the memory cells of the second memory plane, the memory controller may be configured to access memory cells of the second memory plane according to a 2-bit storage scheme according to the erase state E0 and program states P1 to P3.

Figure 13C:
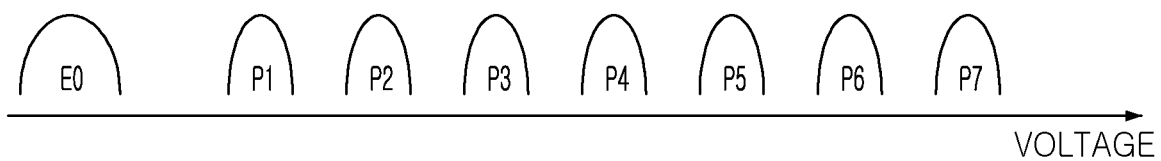
Figure 13D:
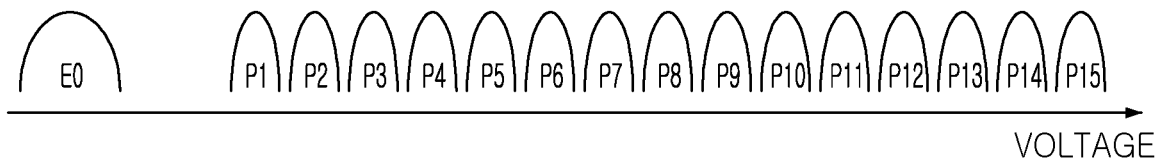

Each of memory cells of the third memory plane may store 3-bit data. Each of the memory cells may have an erase state E0 and one of first to seventh program states P1 to P7 as illustrated in FIG. 13C according to stored data. Similarly, each of memory cells of the fourth memory plane may store 4-bit data. Each of the memory cells may have an erase state E0 and one of first to fifteenth program states P1 to P15 as illustrated in FIG. 13D according to stored data. To implement the 3-bit storage for the memory cells of the third memory plane or the 4-bit storage for the memory cells of the fourth memory plane, the memory controller may be configured to access memory cells of the third memory plane according to a 3-bit storage scheme according to the erase state E0 and program states P1 to P7, and to access memory cells of the fourth memory plane according to a 4-bit storage scheme according to the erase state E0 and program states P1 to P15.

As the numbers of bits of data stored in memory cells of the different memory planes are different, peripheral circuits included in the first to fourth memory planes may be configured differently. As an example, a page buffer circuit included in a peripheral circuit of the first memory plane may include the least number of latches, and a page buffer circuit included in a peripheral circuit of the fourth memory plane may include the highest number of latches. Accordingly, areas in which peripheral circuits are disposed in the memory planes, respectively, may be different from each other.

In example embodiments, memory planes storing data by different methods may be disposed adjacent to each other. As an example, the first memory plane and the second memory plane may be disposed adjacent to each other. Also, at least a portion of the peripheral circuit of the second memory plane disposed in a relatively large area may be disposed in a region of the first memory plane. Accordingly, integration density of the memory device may improve. In the description below, an example embodiment will be described with reference to FIG. 14.

Figure 14:
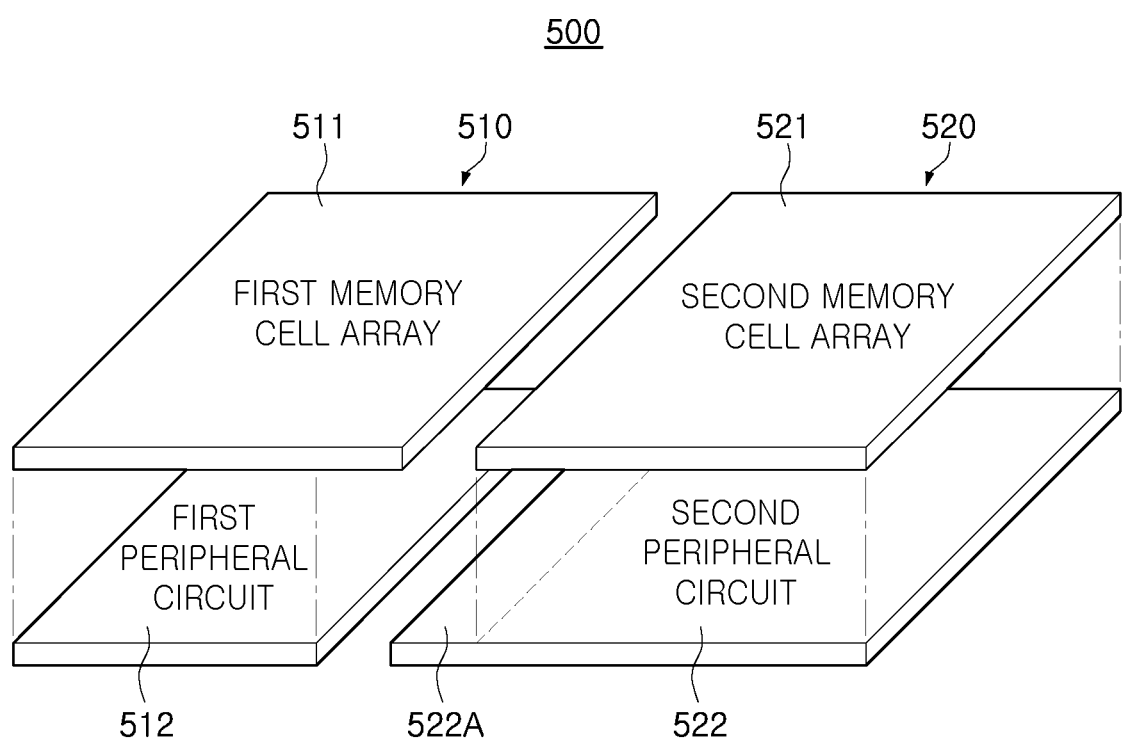
FIG. 14 is a diagram illustrating a structure of a memory device according to an example embodiment of the present inventive concept.

FIG. 14 is a diagram illustrating a structure of a memory device according to an example embodiment.

Referring to FIG. 14, a memory device 500 may include a first memory area 510 and a second memory area 520. The first memory area 510 may include a first memory cell array 511 and a first peripheral circuit 512 disposed below the first memory cell array 511. The second memory area 520 may include a second memory cell array 521 and a second peripheral circuit 522 disposed below the second memory cell array 521. The first memory area 510 and second memory area 520 of the memory device 500 may be part of a single semiconductor chip.

In each of memory cells of the first memory cell array 511, N-bit data may be stored. M-bit data may be stored in each of memory cells of the second memory cell array 521, and M may be greater than N. The first memory cell array 511 and the second memory cell array 521 may have the same (e.g., identical) structure, and may include the same number of memory cells. Accordingly, in the memory device 500 in the example embodiment, memory areas disposed adjacent to each other may include the same number of memory cells, and may have different data storage capacities.

The first peripheral circuit 512 and the second peripheral circuit 522 for driving memory cells of the first and second memory cell arrays 511 and 521 having the same structure may have different structures. For example, the first page buffer circuit of the first peripheral circuit 512 may include a smaller number of latches than the number of latches of the second page buffer circuit of the second peripheral circuit 522. Also, the number of voltages (e.g., voltage levels) output by a voltage generator of the first peripheral circuit 512 may be smaller than the number of voltages output by a voltage generator of the second peripheral circuit 522. Accordingly, the first peripheral circuit 512 may be disposed in an area smaller than an area of the second peripheral circuit 522.

In an example embodiment, to improve integration density of the memory device 500, at least a portion 522A of the second peripheral circuit 522 may be disposed in an adjacent region occupied by first memory area 510. As illustrated in FIG. 14, at least a portion 522A of the second peripheral circuit 522 may be disposed below the first memory cell array 511. Accordingly, integration density of the memory device 500 may improve.

In example embodiments, the first memory area 510 and the second memory area 520 may be simultaneously operated such that operation efficiency of the memory device 500 may improve. In this example embodiment, while a program operation or a read operation is performed in the first memory area 510, a program operation or a read operation may be performed in the second memory area 520 simultaneously. In the description below, an example embodiment will be described with reference to FIGS. 15 to 17.

Figure 15:
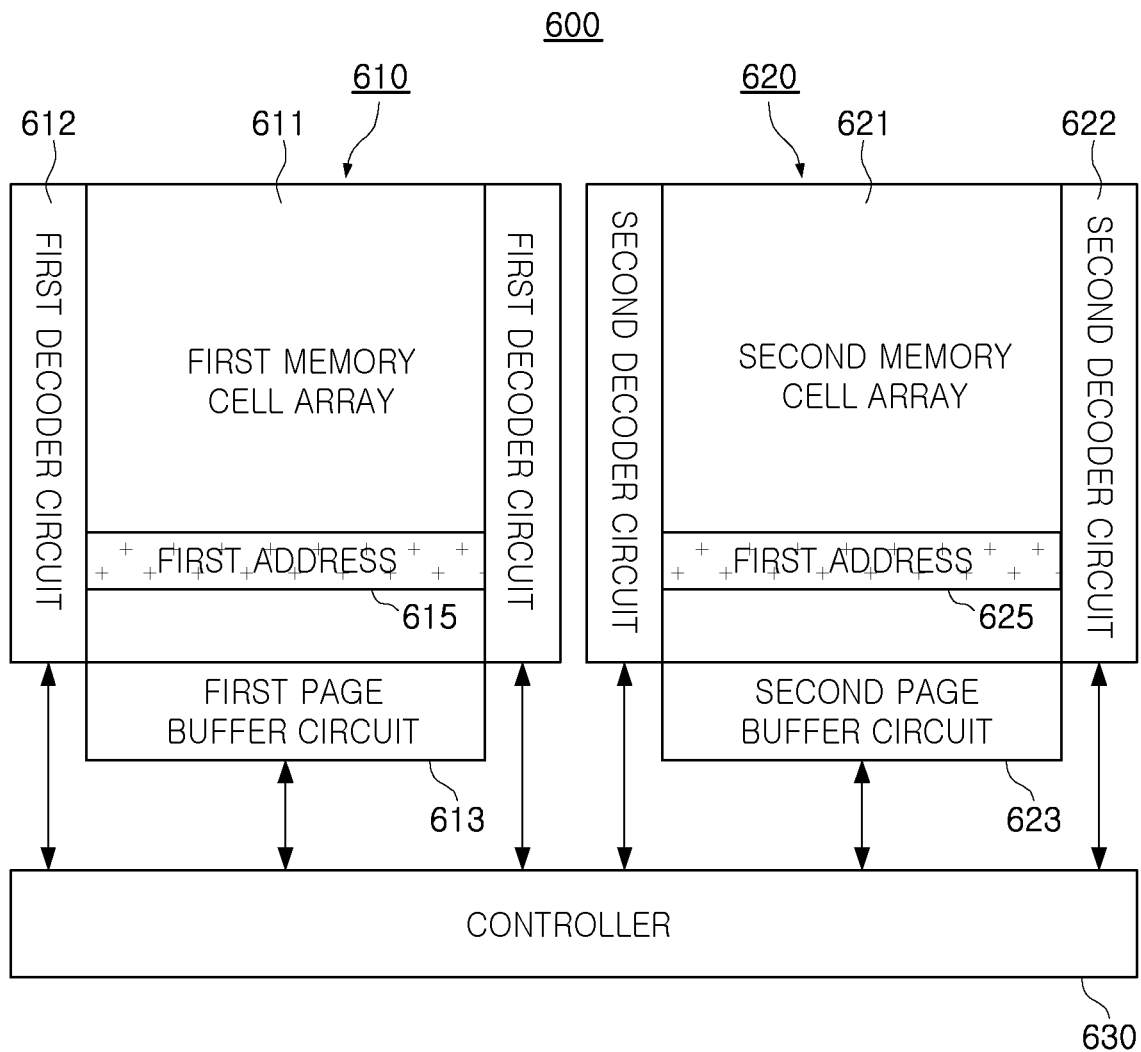
FIGS. 15 to 17 are diagrams illustrating operations of a memory device according to an example embodiment of the present inventive concept.
Figure 16:
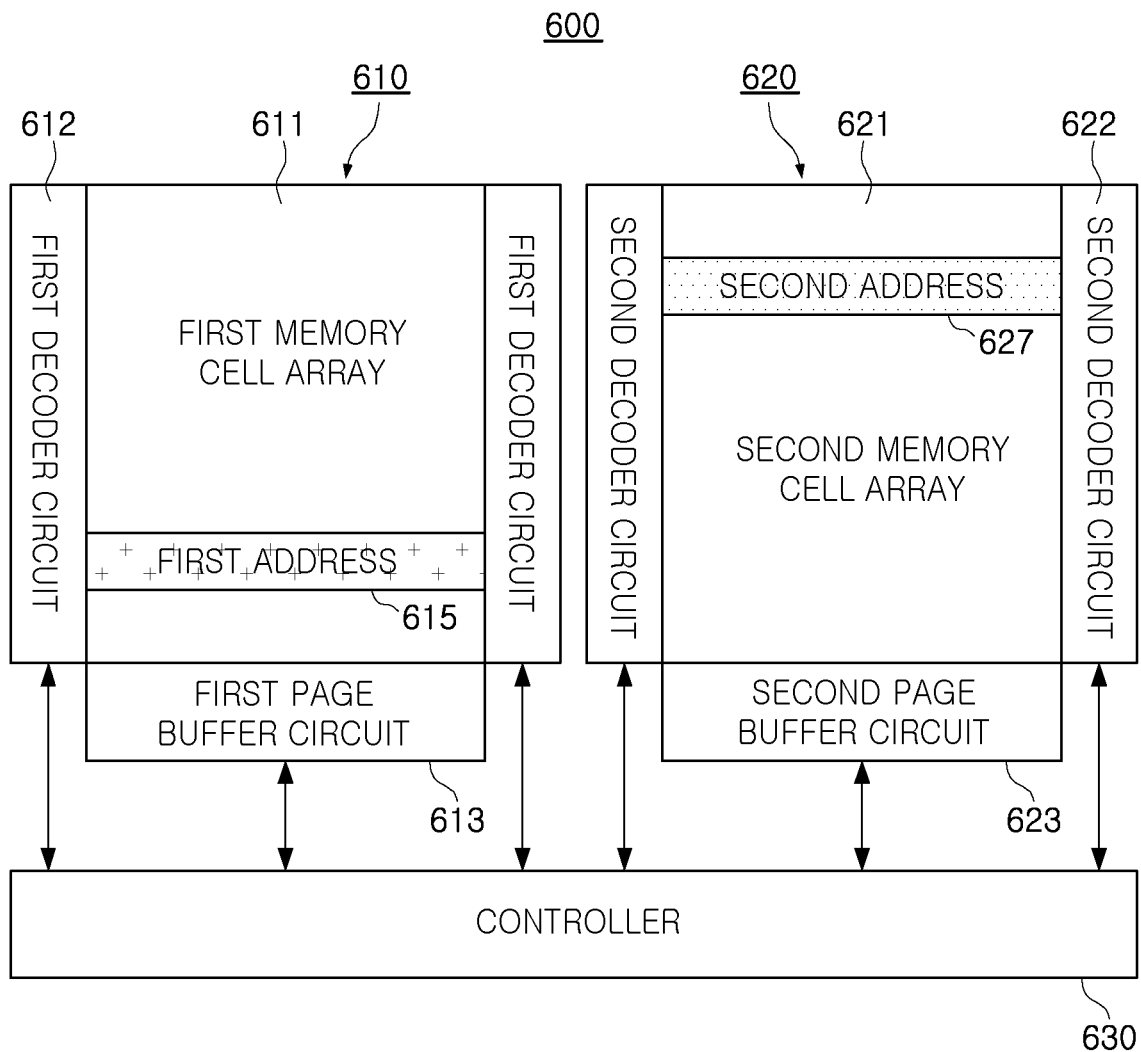
Figure 17:
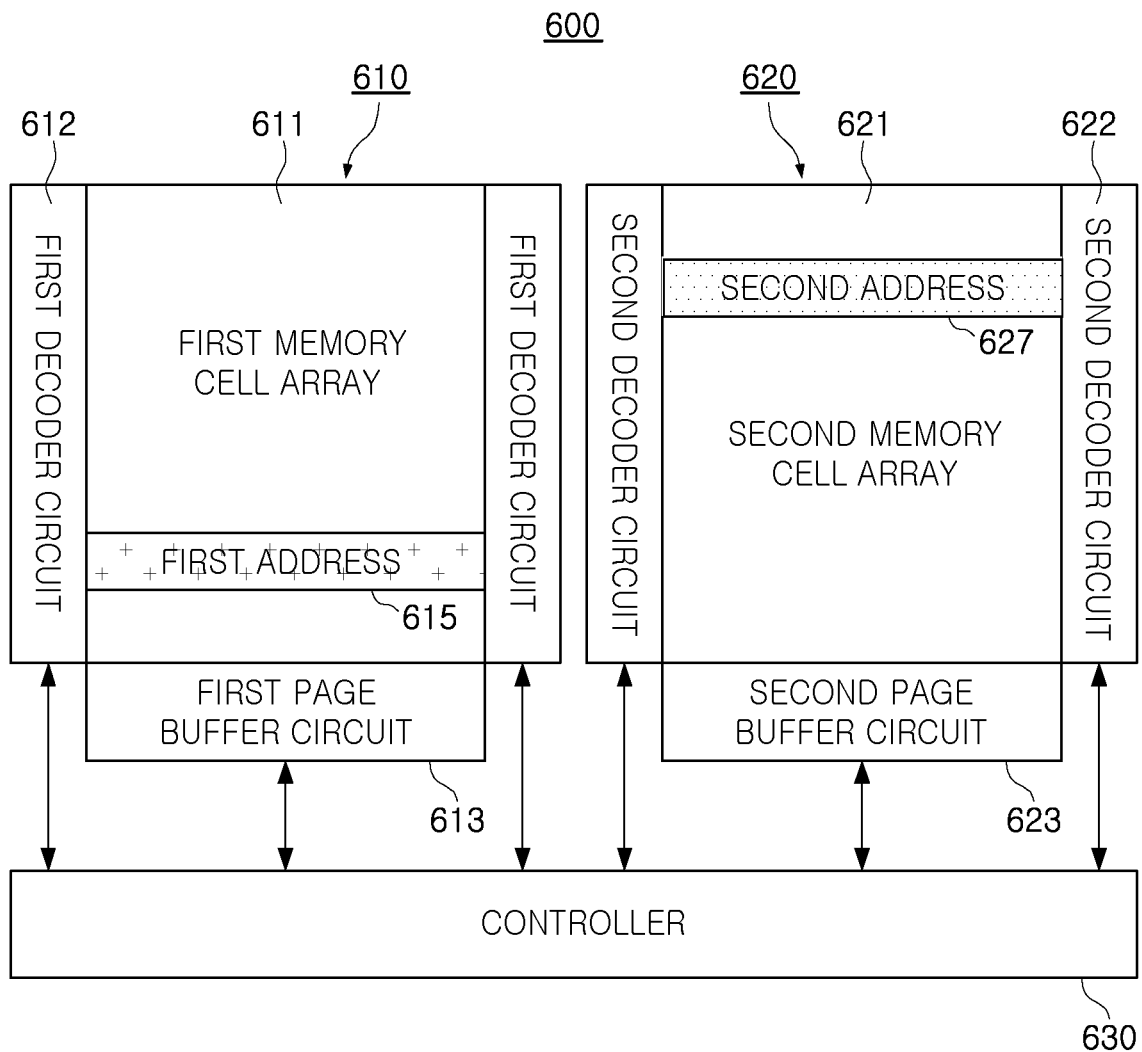

FIGS. 15 to 17 are diagrams illustrating operations of a memory device according to an example embodiment.

In the example embodiments illustrated in FIGS. 15 to 17, a memory device 600 may include a first memory area 610 and a second memory area 620. The number of bits of data stored in each of memory cells of the first memory area 610 may be different from the number of bits of data stored in each of memory cells of the second memory area 620. As an example, each of the memory cells of the first memory area 610 may store N-bit data (N is a natural number), and each of memory cells of the second memory area 620 may store M-bit data (M is a natural number greater than N).

The first memory area 610 and the second memory area 620 may have the same general structure. As an example, the first memory area 610 may include a first memory cell array 611, a first decoder circuit 612, and a first page buffer circuit 613. The first decoder circuit 612 may select at least one of word lines connected to memory cells of the first memory cell array 611, and may input a voltage required for a program operation, a read operation, an erase operation, and the like, to the word lines. The first page buffer circuit 613 may write data in the memory cells of the first memory cell array 611 or may read out data stored in the memory cells. The second memory area 620 may have the same components connected in the same way. However, certain components, such as the peripheral circuit components (e.g., page buffer and decoder circuits), may have different specific structures from each other, as discussed previously.

A controller 630 may drive the first memory area 610 and the second memory area 620 simultaneously. In example embodiments, operations simultaneously performed in the first memory area 610 and the second memory area 620 may be the same operation or different operations. Also, an address at which an operation is performed in the first memory area 610 and an address at which an operation is performed in the second memory area 620 may be the same or different.

Referring to FIG. 15, a controller 630 may perform a first operation, a program operation, for example, in memory cells of the first memory cell array 611 corresponding to a first address 615. The controller 630 may also perform a second operation, a read operation, for example, in memory cells of a second memory cell array 621 corresponding to a first address 625. As such, in the example embodiment illustrated in FIG. 15, different operations may be performed at the same address of the first memory cell array 611 and the second memory cell array 621.

Referring to FIG. 16, the controller 630 may perform a first operation, a program operation, for example, in memory cells of the first memory cell array 611 corresponding to the first address 615. The controller 630 may also perform a first operation in memory cells of the second memory cell array 621 corresponding to a second address 627. In other words, in the example embodiment illustrated in FIG. 16, the same operation may be performed at different addresses of the first memory cell array 611 and the second memory cell array 621 by the controller 630. However, an example embodiment thereof is not limited thereto. Data processed at the first address 615 of the first memory cell array 611 and at the second address 627 of the second memory cell array 621 may be different from each other.

In the example embodiment illustrated in FIG. 17, the controller 630 may perform a first operation, a program operation, for example in memory cells of the first memory cell array 611 corresponding to the first address 615. The controller 630 may also perform a second operation, a read operation, for example, in memory cells of the second memory cell array 621 corresponding to a second address 627. In the example embodiment illustrated in FIG. 17, different operations may be performed at different addresses of the first memory cell array 611 and the second memory cell array 621 by the controller 630.

In the example embodiments illustrated in FIGS. 15 and 17, the first memory area 610 and the second memory area 620 may be configured as areas included in a single semiconductor chip, having multiple memory planes, for example, and the memory device 600 may be provided as a single semiconductor chip. Accordingly, the controller 630 may process a program operation and/or a read operation by operating two or more memory planes simultaneously such that data processing efficiency may increase.

In these example embodiments, the first memory area 610 and the second memory area 620 may operate simultaneously by a control command and data transferred through a single input and output interface and the controller 630. Accordingly, differently from a method of assigning memory cells of two or more semiconductor chips to a single-level memory cell and a multilevel memory cell and simultaneously driving the two or more semiconductor chips, the number of busses required for communication between a host and the memory device 600 may decrease, and a high-speed driving may be implemented at relatively low power consumption.

Figure 18A:
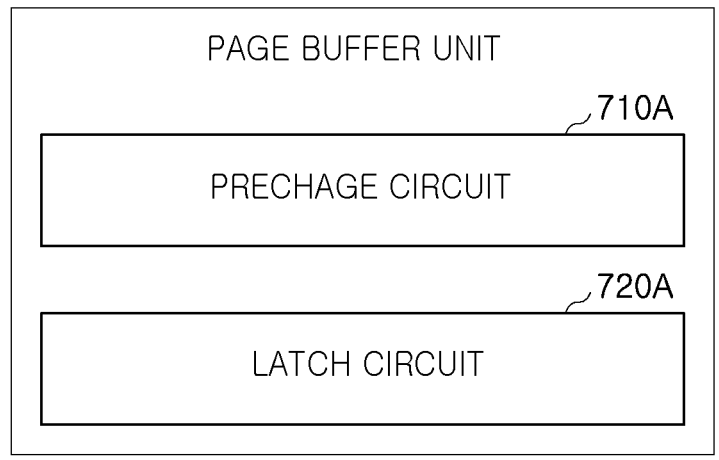
FIGS. 18A and 18B are diagrams illustrating a page buffer included in a memory device according to an example embodiment of the present inventive concept.
Figure 18B:
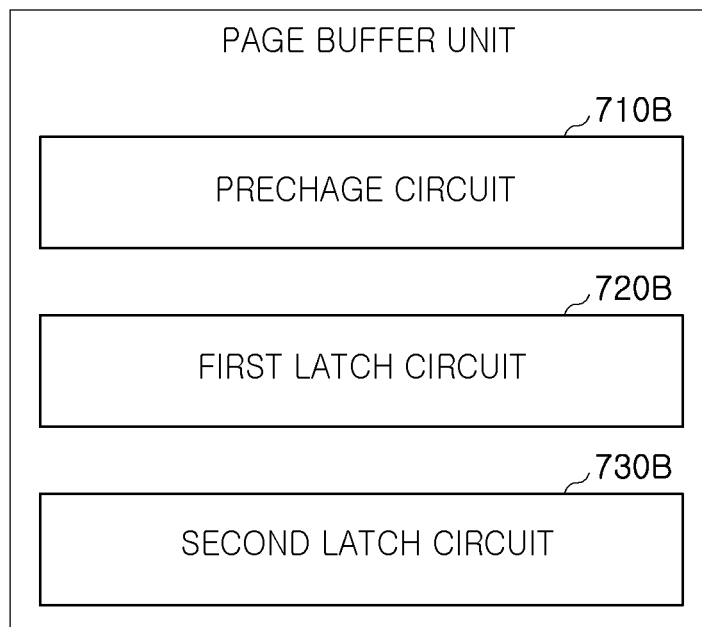

FIGS. 18A and 18B are diagrams illustrating a page buffer included in a memory device according to an example embodiment.

Each of page buffer circuits 700A and 700B illustrated in FIGS. 18A and 18B may be a circuit connected to a single bit line. The page buffer circuits 700A and 700B may have different structures depending on an operation method of a memory cell array connected to each of the page buffer circuits.

The first page buffer circuit 700A in the example embodiment illustrated in FIG. 18A may be connected to a memory cell array in which a single memory cell stores 1-bit data. The first page buffer circuit 700A may include a precharge circuit 710A for precharging a bit line connected to memory cells, and a latch circuit 720A for storing data read out from a selected memory cell or storing data to be written in a selected memory cell.

Referring to FIG. 18B, a second page buffer circuit 700B may be connected to a memory cell array in which a single memory sell stores 2-bit data. The second page buffer circuit 700B may include a precharge circuit 710B for precharging a bit line, and latch circuits 720B and 730B for storing data read out from a selected memory cell or storing data to be written in a selected memory cell.

Each of memory cells of a memory cell array connected to the second page buffer circuit 700B may store a greater number of bits of data than each of memory cells of a memory cell array connected to the first page buffer circuit 700A. Accordingly, the second page buffer circuit 700B may include a greater number of latch circuits 720B and 730B than the first page buffer circuit 700A, and may occupy a relatively greater area.

As described above, the memory device in the example embodiment may have a COP structure in which the memory cell arrays are disposed on the peripheral circuits. Accordingly, the page buffer circuits 700A and 700B may be disposed below the memory cell arrays. In the example embodiment, a first memory area including a first page buffer circuit 700A may be disposed adjacent to a second memory area including the second page buffer circuit 700B. Also, at least a portion of the second page buffer circuit 700B requiring a relatively large area may be disposed in a region occupied by the first memory area, from a top-down view. For example, the first page buffer circuit 700A and at least a portion of the second page buffer circuit 700B may be disposed below the first memory area and the first memory cell array. Accordingly, an area in which the peripheral circuits are disposed may be used in an efficient manner such that integration density of the memory device may improve.

Figure 19:
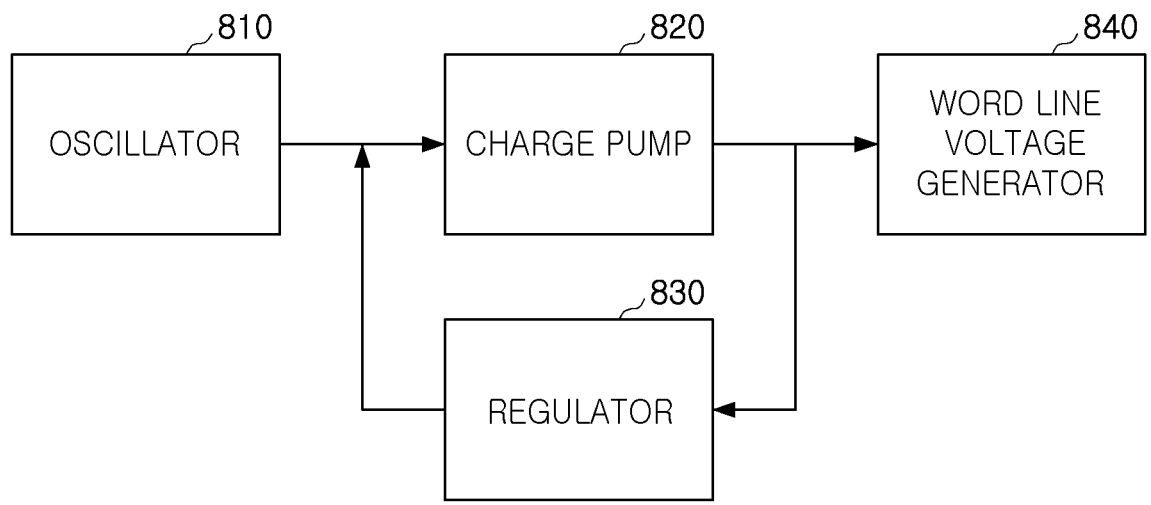
FIGS. 19 and 20 are diagrams illustrating voltage generators included in a memory device according to an example embodiment of the present inventive concept.
Figure 20:
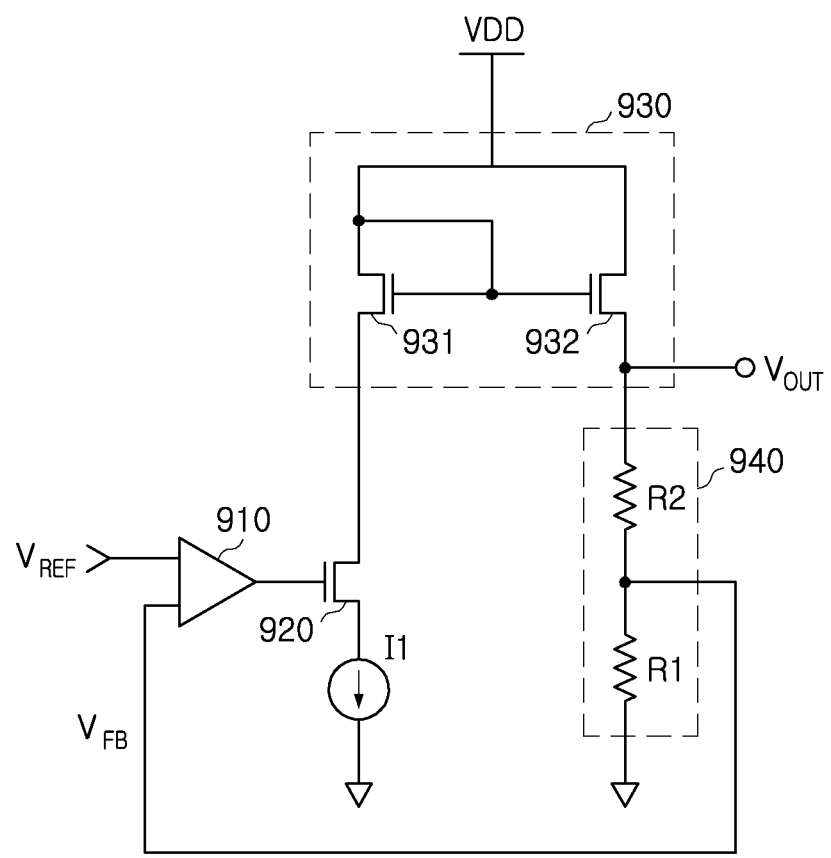

FIGS. 19 and 20 are diagrams illustrating voltage generators included in a memory device according to an example embodiment.

Referring to FIG. 19, a peripheral circuit of the memory device in example embodiments may include a voltage generator 800. The voltage generator 800 may be included in each of memory areas included in the memory device. As an example, a first memory area of the memory device may include a first voltage generator, and a second memory area of the memory device may include a second voltage generator. The first voltage generator and the second voltage generator may have different structures.

The voltage generator 800 may include an oscillator 810, a charge pump 820, a regulator 830, and a word line voltage generator 840. In an example embodiment, the charge pump 820 may operate in response to receiving a clock signal output by the oscillator 810 and a complementary clock signal having a phase difference of 180 degrees with the clock signal.

The charge pump 820 may include a plurality of unit circuits connected to each other in series. As an example, odd-numbered unit circuits of the unit circuits may operate by a clock signal, and even-numbered unit circuits may operate by a complementary clock signal, or vice versa. The number of unit circuits included in the charge pump 820 may be varied depending on memory areas.

The word line voltage generator 840 may generate voltages to be input to word lines in each of a program operation and a read operation. As an example, the word line voltage generator 840 may generate a pass voltage, a read voltage, a program voltage, and the like. When the voltage generator 800 is included in a peripheral circuit of the first memory area in which each of memory cells stores N-bit data (N is a natural number), the number of voltages (i.e., voltage levels) generated by the word line voltage generator 840, the number of pass voltages, for example, may be relatively small. When the voltage generator 800 is included in a peripheral circuit of the second memory area in which each of memory cells stores M-bit data (M is a natural number greater than N), the number of voltages (i.e., voltage levels) generated by the word line voltage generator 840, the number of pass voltages, for example, may be relatively high.

Accordingly, the charge pump 820 of the voltage generator 800 included in the second memory area may include a greater number of unit circuits than the number of unit circuits included in the charge pump 820 of the voltage generator 800 included in the first memory area. The voltage generator 800 of the second memory area may occupy a greater area than an area of the voltage generator 800 of the first memory area. In the example embodiment, at least a portion of the voltage generator 800 of the second memory area may be disposed in a peripheral circuit located to overlap a region occupied by the first memory area, from a top-down view. Accordingly, an area in which the peripheral circuits are disposed may be used in an efficient manner, and integration density of the memory device may improve.

Referring to FIG. 20, a voltage generator 900 in the example embodiment may include a calculation amplifier 910, a transistor 920, a current mirror circuit 930, and a voltage divider 940. The calculation amplifier 910 and the transistor 920 may provide a charging circuit. The calculation amplifier 910 may output a difference between a reference voltage VREF and a feedback voltage VFB, and the transistor 920 may amplify an output of the calculation amplifier 910 and may generate a first current I1.

The current mirror circuit 930 may include a first mirror transistor 931 and a second mirror transistor 932, and may receive a power voltage VDD. The current mirror circuit 930 may mirror the first current I1 output by the charging circuit and may output the first current I1 to the voltage divider 940. The voltage divider 940 may include first resistor R1 and second resistor R2, and a feedback voltage VFB may be determined based on magnitudes of the first resistor R1 and second resistor R2. An output voltage VOUT may be output from a node disposed between the mirror circuit 930 and the voltage divider 940, and the greater the second resistor R2, the more the output voltage VOUT may increase.

The voltage generator 900 included in a peripheral circuit of the first memory area in which N-bit data is stored in each of memory cells may be implemented as the second resistor R2 having a relatively small area. The voltage generator 900 included in a peripheral circuit of the second memory area in which M-bit data is stored in each of memory cells may be implemented as the second resistor R2 having a relatively large area. M may be greater than N.

Accordingly, the voltage generator 900 of the second memory area may occupy a relatively large area as compared to the voltage generator 900 of the first memory area. In the example embodiment, at least a portion of devices included in the voltage generator 900 of the second memory area may be disposed in a peripheral circuit that overlaps the first memory area. Accordingly, the area in which the peripheral circuits are disposed may be used in an efficient manner, and integration density of the memory device may improve.

Figure 21:
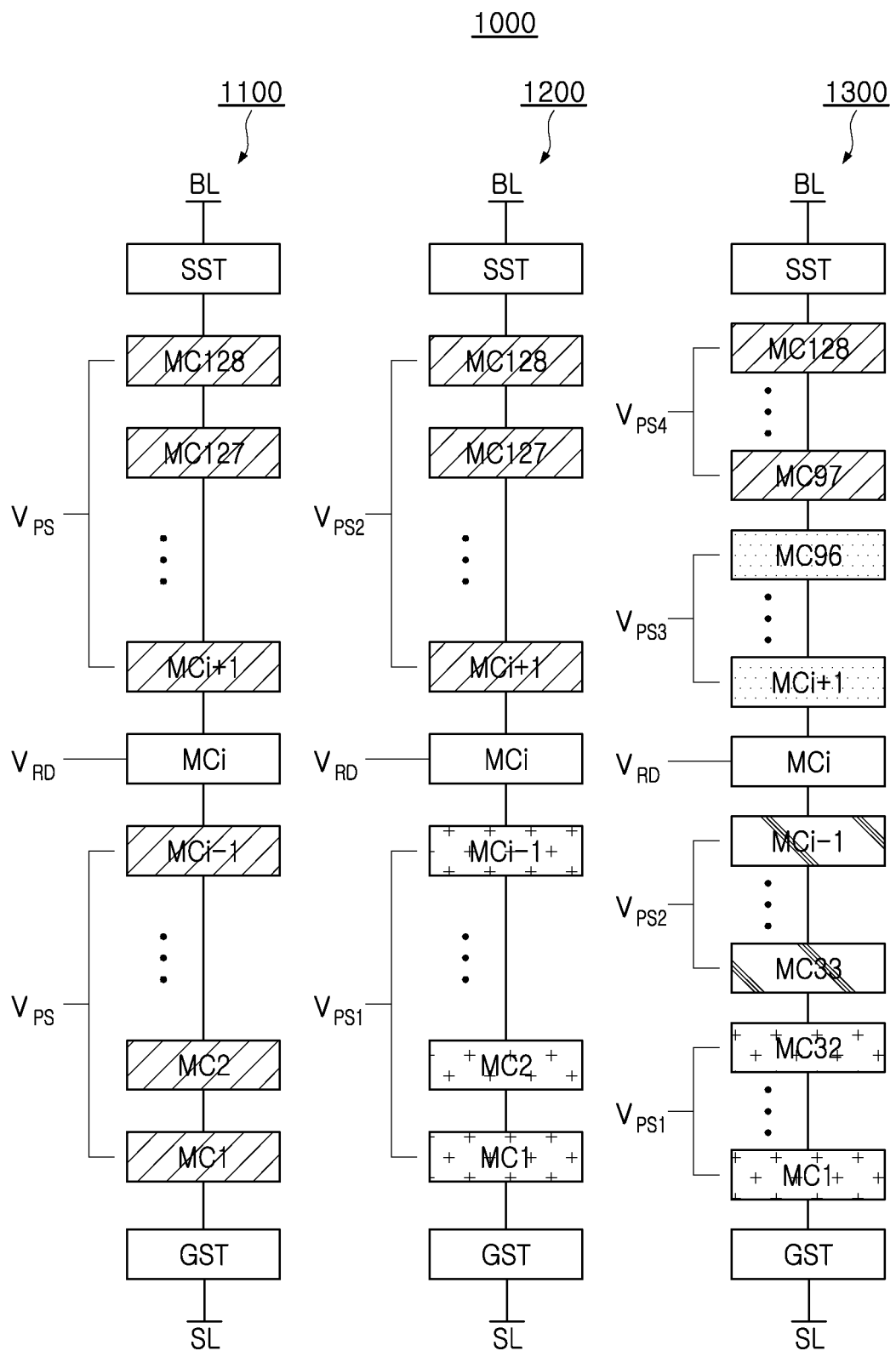
FIGS. 21 and 22 are diagrams illustrating operations of a memory device according to an example embodiment of the present inventive concept.
Figure 22:
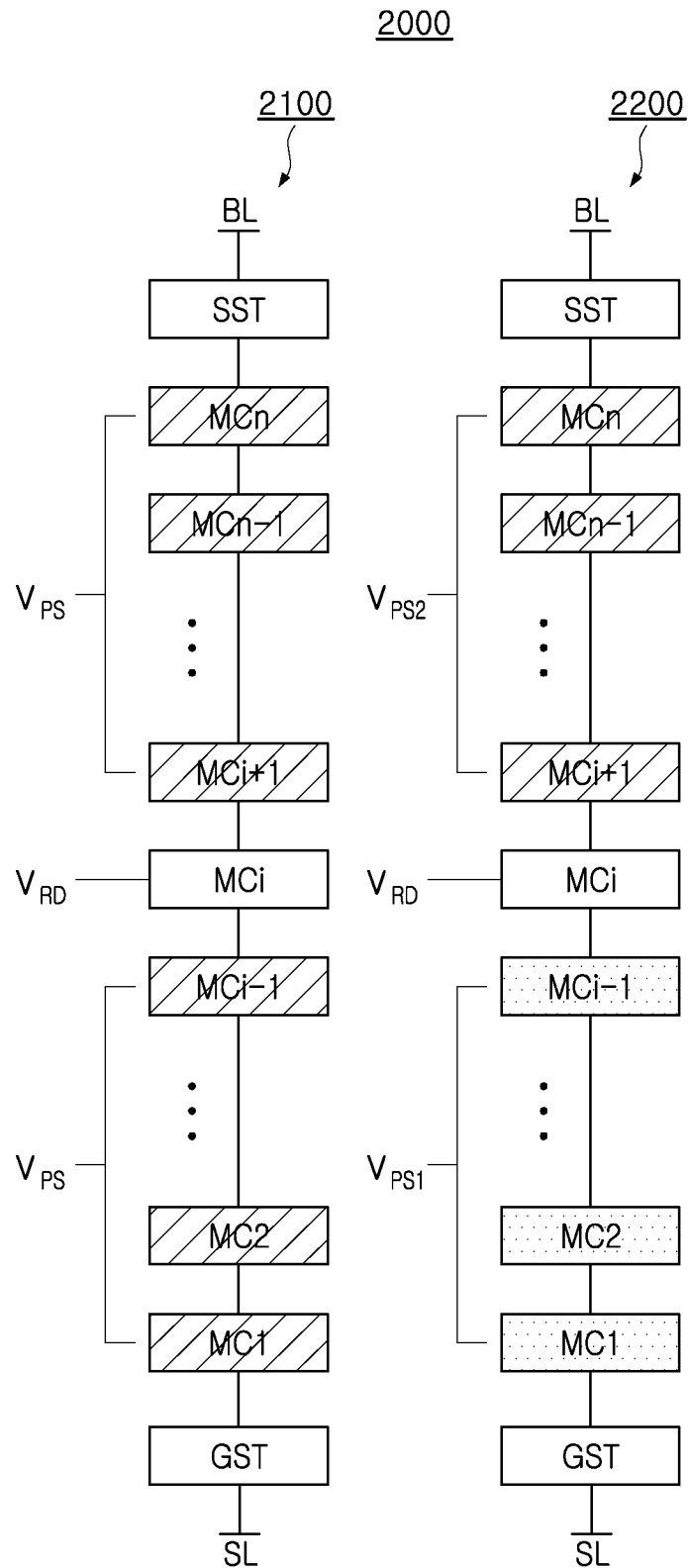

FIGS. 21 and 22 are diagrams illustrating operations of a memory device according to an example embodiment.

Referring to FIG. 21, a memory device 1000 in the example embodiment may include first to third memory cell strings 1100, 1200, and 1300. As an example, the first memory cell string 1100 may be one of memory cell strings included in a first memory area of the memory device 1000. Similarly, the second memory cell string 1200 may be one of memory cell strings included in a second memory area of the memory device 1000, and the third memory cell string 1300 may be one of memory cell strings included in a third memory area of the memory device 1000. The first to third memory cell strings 1100, 1200, and 1300 may correspond to first to third memory planes, respectively.

The first to third memory areas that include memory cells may have the same structure, and accordingly, the first to third memory cell strings 1100, 1200, and 1300 may also have the same structure. As an example, the first memory cell string 1100 may be connected to a plurality of memory cells MC1 to MC128 in series. The number of the memory cells MC1 to MC128 may be varied in example embodiments. The memory cells MC1 to MC128 may be connected to a bit line BL through a string select transistor SST, and may be connected to a source line SL through a ground select transistor GST.

The first to third memory strings may store data by different methods. As an example, each of the memory cells MC1 to MC128 of the first memory string may store 1-bit data according to a 1-bit data storage scheme, each of memory cells of the second memory area may store 2-bit data according to a 2-bit data storage scheme, and each of memory cells of the third memory area may store 4-bit data according to a 4-bit data storage scheme.

In the memory device 1000 in the example embodiment, in a read operation for reading out data, different pass voltages may be input to the first to third memory areas. Referring to FIG. 21, a read voltage VRD may be input to a select memory cell MCi in the first memory cell string 1100, and a pass voltage VPS may be input to remaining non-selected memory cells in common. In the second memory cell string 1200, a first pass voltage VPS1 may be input to a portion (MC1-MCi−1) of non-selected memory cells, and a second pass voltage VPS2 different from the first pass voltage VPS1 may be input to remaining memory cells (MCi+1-MC128) of the non-selected memory cells. Four different pass voltages VPS1 to VPS4 may be input to the non-selected memory cells of the third memory cell string 1300.

Depending on the number of pass voltages required for a read operation, a peripheral circuit of the third memory area may include a voltage generator having an area greater than an area of peripheral circuits of the second memory area and the first memory area. In the example embodiment, at least a portion of devices of the voltage generator included in a peripheral circuit of the third memory area may be disposed to overlap the first memory area or the second memory area. Accordingly, the peripheral circuit of the memory device may be disposed in an efficient manner, and integration density of the memory device may improve.

Referring to FIG. 22, a memory device 2000 in the example embodiment may include first and second memory cell strings 2100 and 2200. The first memory cell string 2100 and the second memory cell string 2200 may be included in different memory blocks in a single memory plane of the memory device 2000.

As an example, the first memory cell string 2100 may be in a state in which non-selected memory cells other than a selected memory cell MCi are not programed. Accordingly, in a read operation for the selected memory cell MCi of the first memory cell string 2100, a single pass voltage VPS may be input to the non-selected memory cells in common.

In the second memory cell string 2200, a portion (MC1-MCi−1) of the non-selected memory cells other than the selected memory cell MCi may be programmed. In a read operation for the selected memory cell MCi of the second memory cell string 2200, the memory device 2000 may input a first pass voltage VPS1 to the programed non-selected memory cells (MC1-MCi−1), and may input a second pass voltage VPS2 different from the first pass voltage VPS1 to non-selected memory cells (MCi+1-MC128) which have not been programed. In an example embodiment, the first pass voltage VPS1 may be less than the first pass voltage VPS1.

According to the aforementioned example embodiments, a first memory area in which a single memory cell stores N-bit data and a second memory area in which a single memory cell stores M-bit data greater than N-bit data may be included in a single memory chip, and a peripheral circuit of the second memory area occupying a relatively large area may be disposed to overlap the first memory area. Also, data may be stored in the first memory area or the second memory area depending on an importance of data to be stored. Accordingly, integration density of the memory device may improve and operation efficiency may increase at the same time, and a memory device and a memory system optimized to a neuromorphic computer system and an autonomous driving apparatus may be provided.

While the example embodiments have been shown and described above, it will be apparent to those skilled in the art that modifications and variations could be made without departing from the scope of the present invention as defined by the appended claims.

What is claimed is:

1. A memory device, comprising:
a first memory area including a first memory cell array having a plurality of first memory cells each for storing N-bit data, where N is a natural number, and a first peripheral circuit for controlling the first memory cells according to an N-bit data access scheme and disposed below the first memory cell array;
a second memory area including a second memory cell array having a plurality of second memory cells each for storing M-bit data, where M is a natural number greater than N, and a second peripheral circuit for controlling the second memory cells according to an M-bit data access scheme and disposed below the second memory cell array, wherein the first memory area and the second memory area are included in a single semiconductor chip and share an input and output interface; and
a controller configured to generate calculation data by applying a weight stored in the first memory area to sensing data in response to receiving the sensing data obtained by an external sensor, and store the calculation data in one of the first memory area or the second memory area according to the weight.

2. The memory device of claim 1, wherein the controller is configured to store the calculation data having a weight higher than a predetermined reference value in the first memory area, and to store the calculation data having a weight lower than the reference value in the second memory area.

3. The memory device of claim 1,
wherein the first peripheral circuit includes a first page buffer circuit and a first decoder circuit, and the second peripheral circuit includes a second page buffer circuit and a second decoder circuit, and
wherein an area in which the first page buffer circuit is disposed is smaller than an area in which the second page buffer circuit is disposed.

4. The memory device of claim 3,
wherein the first memory area and the second memory area are disposed adjacent to each other, and
wherein at least a portion of circuit devices included in the second peripheral circuit is disposed below the first memory cell array to overlap the first memory cell array from a top-down view.

5. The memory device of claim 1, wherein the first memory area is configured as a first memory plane, and the second memory area is configured as a second memory plane.

6. The memory device of claim 1, wherein the first memory cell array and the second memory cell array have identical structure.

7. The memory device of claim 1, wherein the controller is configured to perform a program operation or a read operation for a first address of the first memory area simultaneously with a program operation or a read operation for a second address of the second memory area.

8. A memory system, comprising:
a first memory device provided as a first semiconductor chip;
a second memory device sharing an input and output bus to which data is transmitted with the first memory device, and provided as a second semiconductor chip different from the first semiconductor chip; and
an external interface connected to the input and output bus and configured to transmit and receive the data with an external device,
wherein each of the first memory device and the second memory device includes:
a first memory plane including a first memory cell array having first memory cells each for storing N-bit data, where N is a natural number, and a first page buffer circuit disposed below the first memory cell array and configured to perform a program operation and a read operation according to an N-bit data access scheme for at least one first select memory cell of the first memory cells; and
a second memory plane including a second memory cell array having second memory cells each for storing M-bit data, where M is a natural number greater than N, and a second page buffer circuit disposed below the second memory cell array and configured to perform a program operation and a read operation according to an M-bit data access scheme for at least one second select memory cell of the second memory cells.

9. The memory system of claim 8,
wherein each of the first memory cells are configured to store 1-bit data, and each of the second memory cells are configured to store 2-bit data, and
wherein each of the first memory device and the second memory device further includes a third memory plane having third memory cells each configured to store 3-bit data and a fourth memory plane having fourth memory cells each configured to store 4-bit data.

10. The memory system of claim 9, wherein each of the first memory device and the second memory device includes a memory controller configured to generate calculation data by applying a weight stored in the first memory plane to data in response to receiving the data through the input and output bus, and store the calculation data in at least one of the first to fourth memory planes.

11. The memory system of claim 10,
wherein the first memory plane stores the calculation data having a weight equal to or higher than a first reference value,
wherein the second memory plane stores the calculation data having a weight smaller than the first reference value and equal to or higher than a second reference value,
wherein the third memory plane stores the calculation data having a weight smaller than the second reference value and equal to or higher than a third reference value, and
wherein the fourth memory plane stores the calculation data having a weight smaller than the third reference value and equal to or higher than a fourth reference value.

12. The memory system of claim 10,
wherein the data is sensing data received from a sensor connected to the external interface, and
wherein the memory controller is configured to determine the weight based on an amount of change in event information included in the sensing data.

13. The memory system of claim 9, wherein, in each of the first memory device and the second memory device, the first to fourth memory planes share a single input and output interface.

14. The memory system of claim 9, wherein, in each of the first memory device and the second memory device, at least two or more of the first to fourth memory planes perform at least one of a program operation and a read operation.

15. An autonomous driving apparatus implementing an autonomous driving function of a vehicle, the autonomous driving apparatus comprising:
- a sensor configured to monitor a first sensing area and to output first sensing data in response to an event generated in a first space external to the vehicle and corresponding to the first sensing area, and configured to monitor a second sensing area and to output second sensing data in response to an event generated in a second space different from the first space and corresponding to the second sensing area;
- a processor configured to control movement of the vehicle according to the first sensing data and the second sensing data; and
- a memory device configured to generate first calculation data by applying a first weight to the first sensing data, generate second calculation data by applying a second weight lower than the first weight to the second sensing data, store the first calculation data in a first memory plane having memory cells each for storing N-bit data according to an N-bit data access scheme, where N is a natural number, and store the second calculation data in a second memory plane having memory cells each for storing M-bit data according to an M-bit data access scheme, where M is a natural number greater than N.

16. The autonomous driving apparatus of claim 15, wherein each of the first memory plane and the second memory plane includes a memory cell array and a peripheral circuit disposed below the memory cell array.

17. The autonomous driving apparatus of claim 15, wherein the sensor is mounted on a front surface of the vehicle, and a field of view of the first sensing area is smaller than a field of view of the second sensing area.

18. The autonomous driving apparatus of claim 15, wherein the first memory plane stores weight information including the first weight and the second weight.

19. The autonomous driving apparatus of claim 15, wherein a level of the first weight is proportional to an amount of change between the first sensing data and previous sensing data output from the first sensing area earlier and stored in the first memory plane.

20. The autonomous driving apparatus of claim 15, wherein the event is sensed based on a difference between previous sensing data output by the sensor earlier and stored in the memory device and the first sensing data or the second sensing data.

* * * * *